(12) United States Patent
Yamamoto et al.

(10) Patent No.: US 7,301,416 B2
(45) Date of Patent: Nov. 27, 2007

(54) SEMICONDUCTOR INTEGRATED CIRCUIT FOR WIRELESS COMMUNICATION

(75) Inventors: Satoru Yamamoto, Takasaki (JP); Kazuhisa Okada, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 129 days.

(21) Appl. No.: 11/178,511

(22) Filed: Jul. 12, 2005

(65) Prior Publication Data
US 2006/0014510 A1 Jan. 19, 2006

(30) Foreign Application Priority Data
Jul. 16, 2004 (JP) ............................... 2004-210289

(51) Int. Cl.
*H03L 7/18* (2006.01)
(52) U.S. Cl. .................... 331/179; 331/14; 331/25; 455/260
(58) Field of Classification Search .................. 331/14, 331/25, 179; 455/260
See application file for complete search history.

(56) References Cited

U.S. PATENT DOCUMENTS 6,563,387 B2 * 5/2003 Hirano et al. ................ 331/11
6,993,307 B2 * 1/2006 Welland et al. .............. 455/260
7,123,102 B2 * 10/2006 Uozumi et al. ................ 331/34
7,148,764 B2 * 12/2006 Kasahara et al. ............ 331/179

FOREIGN PATENT DOCUMENTS

JP 2003-152535 5/2003

* cited by examiner

*Primary Examiner*—Benny Lee
*Assistant Examiner*—James Goodley
(74) *Attorney, Agent, or Firm*—Mattingly, Stanger, Malur & Brundidge, PC

(57) ABSTRACT

A semiconductor integrated circuit with a PLL (Phase Locked Loop) built therein is used in a semiconductor integrated circuit for wireless communication. The PLL circuit generates an oscillation signal having a predetermined frequency, which is combined with a receive signal or a transmit signal for wireless communication. The PLL circuit includes a VCO capable of switching an oscillation frequency band, a variable divider, a loop filter and a phase comparator. An oscillation frequency of the VCO is controlled according to the difference in phase between a signal obtained by dividing the output of the VCO and a reference signal, and a discrimination circuit makes a decision as to a lead or delay of the phase of an output of the variable divider with respect to a reference signal having a predetermined frequency. An auto band selection circuit generates a signal for selecting a frequency band for the VCO.

11 Claims, 12 Drawing Sheets

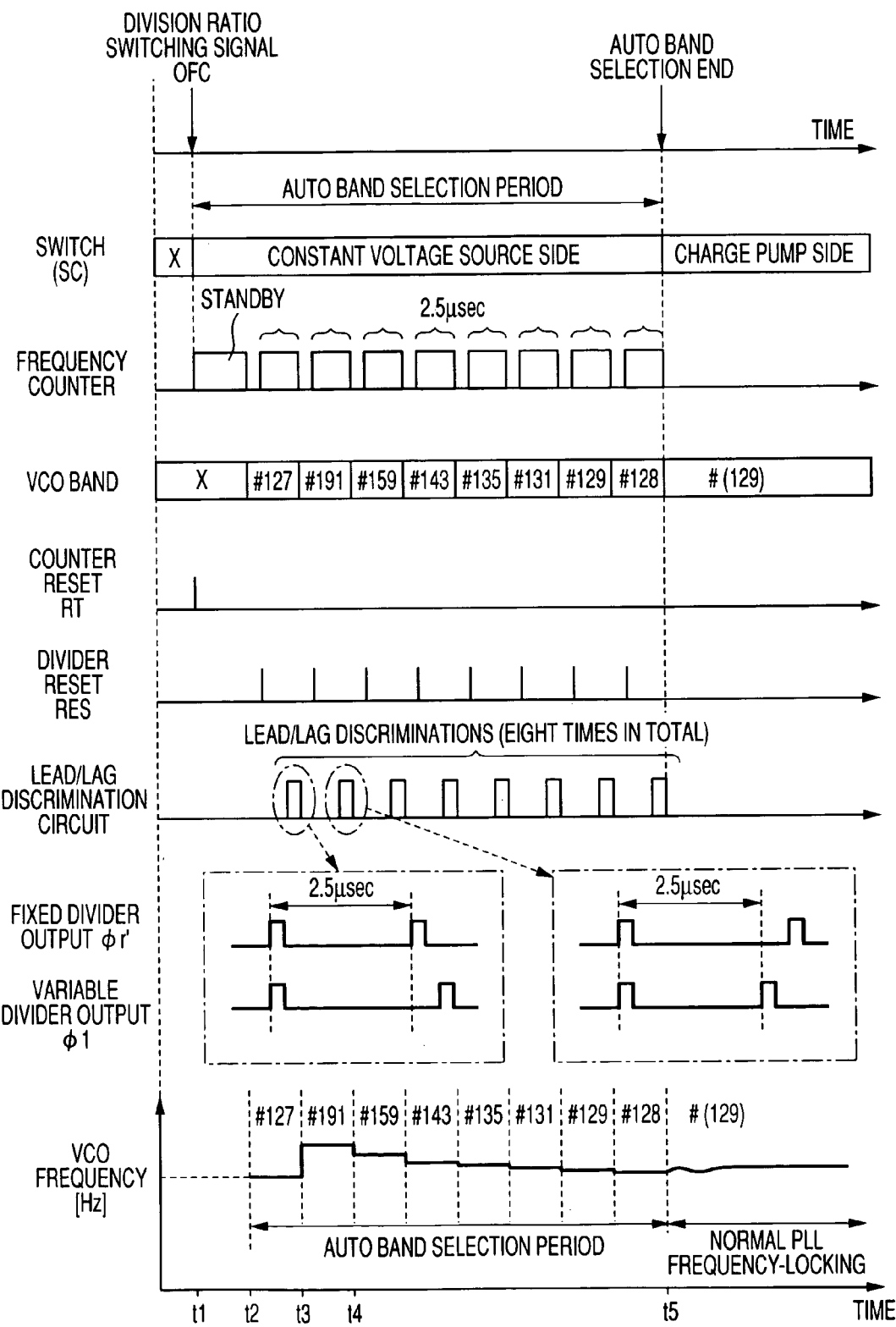

SEMICONDUCTOR INTEGRATED CIRCUIT FOR WIRELESS COMMUNICATION

CROSS-REFERENCE TO RELATED APPLICATION

The present application claims priority from Japanese patent application No. 2004-210289 filed on Jul. 16, 2004, the content of which is hereby incorporated by reference into this application.

BACKGROUND OF THE INVENTION

The present invention relates to a technique effective if applied to a semiconductor integrated circuit with a PLL (Phase Locked Loop) built therein, and relates to, for example, a technique effective if used in a semiconductor integrated circuit for wireless communication, which incorporates therein a PLL circuit that generates an oscillation signal having a predetermined frequency, which is combined with a receive signal or a transmit signal for wireless communication.

In a wireless communication system like a cellular phone, a high-frequency semiconductor integrated circuit (hereinafter called "high-frequency IC") has been used which includes a PLL circuit including an oscillator that generates a local oscillation signal having a predetermined frequency, combined with a receive signal or a transmit signal and which modulate the transmit signal and demodulates the receive signal. As the cellular phone, there has heretofore been known a dual band type cellular phone capable of treating signals lying in two frequency bands like, for example, GSM (Global System for Mobile Communication) of a 880 to 915 MHz band and DCS (Digital Cellular System) of a 1710 to 1785 MHz band. In such a dual band type cellular phone, there is known one wherein one PLL circuit is capable of adapting to two bands by switching the frequency of the PLL circuit.

In recent years, however, there has been a demand for a triple band type cellular phone capable of treating signals employed in a PCS (Personal Communication System) of a 1850 to 1915 MHz band in addition to GSM and DCS. It is expected that the cellular phone needs to be capable of adapting to many types further in future years. A voltage-controlled oscillator (VCO) used in the cellular phone adaptable to such plural types needs to have a wide oscillation frequency range. When one VCO intends to adapt to all frequencies now, the sensitivity (hereinafter called "control sensitivity") of an oscillation frequency to a control voltage of the VCO becomes high, thereby causing trouble that it is susceptible to external noise and a variation in power supply voltage.

Thus, there has been proposed the invention wherein the control sensitivity of the VCO can be reduced while holding a desired oscillation frequency range by allowing the VCO to be used by being switched to a plurality of frequency bands (e.g., 16 frequency bands) (refer to a patent document 1 (Japanese Unexamined Patent Publication No. 2003-152535)). Incidentally, the invention of the previous application adopts a type wherein actual frequencies are measured over all frequency bands for the VCO in advance before the start of operation and stored in a memory, and when oscillation frequency information is given, the oscillation frequency information and the frequency measured value in the memory are compared to decide the optimum frequency band.

In the cellular phone, however, efforts have recently been made to incorporate many circuits into one or several semiconductor integrated circuits as much as possible in order to reduce the number of parts and bring the device into less size and cost. As one of them, there is known an attempt to build a loop filter provided on a PLL loop lying in a high-frequency IC into a semiconductor chip.

SUMMARY OF THE INVENTION

The loop filter for the PLL comprises capacitive and resistive elements. Such a loop filter has heretofore been made up of external elements in most cases. This is because when an attempt is made to bring a capacitive element having a capacitance value necessary to obtain a desired characteristic into on-chip form, the area of the element becomes very large. The resistance value of the resistive element may be increased to reduce the capacitance value. However, thermal noise of the resistive element increases with the increase in resistance value. The PLL is accompanied by a problem that since the voltage of the loop filter is directly applied to a control terminal of the VCO, the thermal noise produced in the resistive element appears on the output of the VCO when the thermal noise of the resistive element constituting the loop filter is high and the control sensitivity of the VCO is high.

Thus, the present inventors or the like have discussed that the number of oscillation frequency bands for the VCO is further increased and the rate of a change in oscillation frequency with respect to a change in control voltage at each individual frequency band is reduced to lower the control sensitivity of the VCO, and the influence of the thermal noise is made hard to appear on the output of the VCO even though the resistive element constituting the loop filter is increased.

However, it has been fount out that a problem arises in that when such a system that the actual frequencies are measured over all the frequency bands in advance and stored in the memory to decide the oscillation frequency band to be used, is applied as in the invention of the previous application where the number of the oscillation frequency bands for the VCO increases, the time required to measure the frequency of the VCO becomes long and hence power consumption increases, and the capacity of the memory that stores the result of measurement must be increased, thus leading to an increase in chip size.

Therefore, the present inventors have reached the conclusion that when the number of the oscillation frequency bands for the VCO is very large, such a used-frequency band determining system as proposed by the invention of the previous application is not suitable. Thus, as the system for deciding the frequency band used for the VCO, a discussion has been made of a system wherein while frequency bands for the VCO are being sequentially switched by a dichotomizing search method, the optimum frequency band is decided by phase comparison with a reference oscillation signal.

As a result, when the oscillation signal of the VCO and the reference oscillation signal are phase-compared, it is necessary to phase-compare a signal obtained by dividing the oscillation signal for the VCO and the reference oscillation signal. Further, in order to perform an accurate and prompt phase comparison, there is a need to reset a divider for dividing the oscillation signal of the VCO by a reset signal generated based on the reference oscillation signal and thereafter perform a phase comparison. However, it has been revealed that there is a problem that the phase of the divided signal is shifted due to a delay in reset signal so that the accurate frequency band cannot be determined.

Incidentally, there are considered, as the causes for the delay in reset signal, causes that, for example, the distance from a reset signal generating circuit to the divider is long and the divider must be constituted of a bipolar transistor circuit in terms of the need for a high-speed operation, and the reset signal generating circuit must be provided with a level shift circuit in a reset signal supply path where it comprises a CMOS circuit for the purpose of a reduction in power consumption.

An object of the present invention is to provide a semiconductor integrated circuit for wireless communication, which is capable of oscillating operation over a wide frequency range with high accuracy and in which control sensitivity of a VCO is low and a PLL loop is less subject to noise.

Another object of the present invention is to provide a semiconductor integrated circuit (high-frequency IC) for wireless communication with a PLL built therein, wherein when a dichotomizing search method for determining the optimum used frequency band by phase-comparison with a reference oscillation signal while frequency bands for a VCO are being sequentially switched, is adopted as a system for deciding the optimum used frequency band, the selection of a frequency band improper due to a delay in reset signal can be avoided.

A further object of the present invention is to provide a semiconductor integrated circuit (high-frequency IC) with a PLL built therein, which is capable of preventing solid variations from occurring in the accuracy for determination of a frequency band due to variations in manufacture and thereby improving yields.

A still further object of the present invention is to provide a semiconductor integrated circuit (high-frequency IC) for wireless communication with a PLL built therein, which is capable of deciding an accurate frequency band while increases in circuit area and chip size are being suppressed.

The above, other objects and novel features of the present invention will become apparent from the description of the present specification and the accompanying drawings.

Summaries of representative ones of the inventions disclosed in the present application will be explained in brief as follows.

That is, there is provided a PLL loop which includes a VCO capable of switching or selecting an oscillation frequency band, a variable divider, a loop filter and a phase comparator and which compares a signal obtained by dividing the output of the VCO and a reference signal by the phase comparator and controls an oscillation frequency of the VCO according to the difference in phase between the two signals, and which further comprises a discrimination circuit which makes a decision as to a lead or delay of the phase of an output of the variable divider with respect to a reference signal having a predetermined frequency, an auto band selection circuit which generates a signal for selecting a frequency band for the VCO, based on an output of the discrimination circuit, and a delay compensating circuit which measures a shift at the phase discrimination based on a signal delay and applies such a delay as to compensate for it to a signal divided by a constant divider, wherein, while the frequency band for the VCO is being switched, the optimum frequency band is found out by a dichotomizing search system to decide a frequency band to be used.

According to the above means, a used frequency band can be determined within a relatively short time even if the number of frequency bands for the VCO is increased to reduce control sensitivity. Further, even though a signal inputted to a phase lead/lag discrimination circuit and compared is shifted in timing due to a delay or the like in reset signal for resetting the variable divider, such a delay as to compensate for it is applied to a signal divided by the variable divider. Therefore, the optimum used frequency band is selected and thereby high-accuracy oscillation control is enabled.

Further, according to the above means, it becomes easy to build the loop filter in its corresponding semiconductor chip. There has heretofore been a fear that although the resistance value of a resistive element that constitutes the loop filter may be increased to reduce the capacitance value of a capacitive element of the loop filter using an external element because the capacitance value is large, without changing the characteristic of the filter and bring the capacitive element into on-chip form, thermal noise of the resistive element increases with the increase in resistance value. While on the contrary, according to the means, since the control sensitivity of the VCO can be reduced, it is possible to suppress the appearance of noise on the output of the VCO even if the thermal noise occurs more or less. Therefore, the resistance value of the resistive element that constitutes the loop filter can be made high. Thus, since the capacitance value of the capacitive element can be reduced correspondingly, on-chipping becomes easy.

Preferably, the delay compensating circuit detects the delay in reset signal or the shift in timing of the signal inputted to the phase lead/lag discrimination circuit and compared, and applies a delay corresponding to the result of detection to the signal divided by the variable divider. Thus, an accurate used frequency band can be decided without so increasing a circuit's occupied area.

Advantageous effects obtained by typical ones of the inventions disclosed in the present application will be explained in brief as follows:

According to the present invention, it is not necessary to measure oscillation frequencies in all frequency bands in advance and store them in a memory. Therefore, the time taken until a used frequency band is decided, becomes short and the occupied area of a circuit can be reduced. Since there is provided a delay compensating circuit which applies a delay to a signal divided by a variable divider, it is possible to avoid that a frequency band improper due to a delay in reset signal or the like is selected.

Further, according to the present invention, it is possible to prevent solid variations from occurring in the accuracy for determination of a frequency band due to variations in manufacture and improve yields. Further, since a delay compensating circuit is used to detect a shift in timing of a signal and apply a delay to a signal divided by a variable divider in accordance with the result of detection, an accurate frequency band can be determined while increases in circuit area and chip size are being suppressed.

BRIEF DESCRIPTION OF THE DRAWINGS

FIG. 5 is a timing chart showing operating timings for band selection, which are employed in the PLL circuit shown in FIG. 1;

DETAILED DESCRIPTION OF THE PREFERRED EMBODIMENTS

Preferred embodiments of the present invention will next be described with reference to the accompanying drawings.

Figure 1:
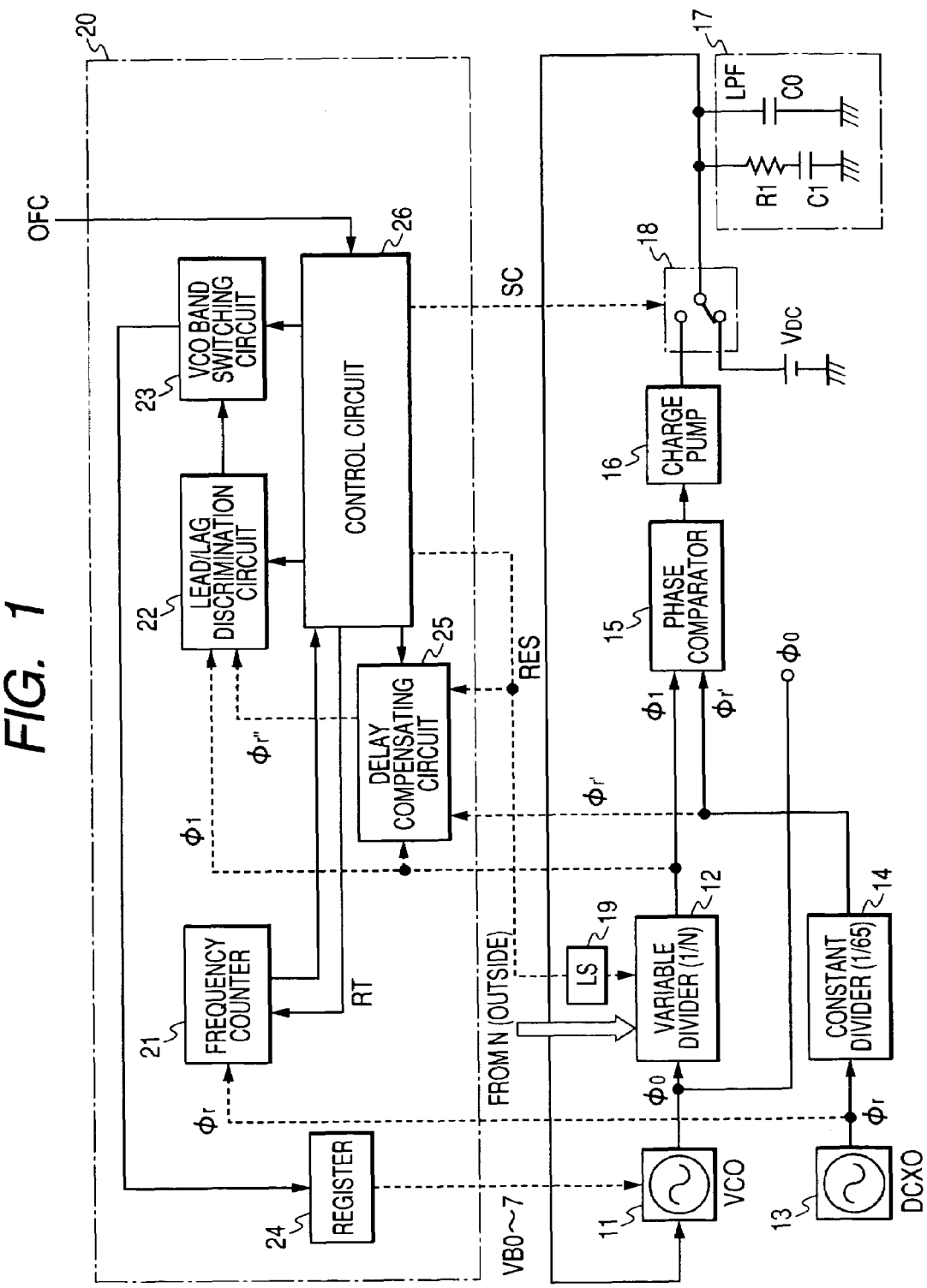
FIG. 1 is a block diagram showing one example of a PLL circuit according to the present invention.

One embodiment of a PLL circuit according to the present invention, which has the function of automatically selecting a band to be used by a VCO, based on set frequency information provided from outside is shown in FIG. 1.

The PLL circuit according to the present embodiment includes a voltage-controlled oscillator (VCO) 11, a variable divider 12 which divides an oscillation signal φ0 of the VCO 11 into 1/N, a constant divider 14 which divides an oscillation signal φr outputted from a reference oscillator (DCXO) 13 for generating the reference oscillation signal φr like 26 MHz, a phase comparator 15 which detects a difference in phase between signals φ1 and φr' divided by the variable divider 12 and the constant divider 14 respectively, a charge pump 16 which generates a charge current or a discharge current corresponding to the detected difference in phase, and a loop filter 17 which smoothes the output of the charge pump 16. A voltage smoothed by the loop filter 17 is fed back to the VCO 11 as a control voltage Vt in such a manner that the oscillation frequency of the VCO 11 is controlled.

Although not restricted in particular, the VCO 11 is configured so as to have 256 frequency bands (hereinafter called bands) in the present embodiment. The constant divider 14 has a division ratio of, for example, 1/65 and is configured so as to divide the reference oscillation signal φr of 26 MHz to produce a signal of 400 kHz. The loop filter 17 is constituted of a capacitor C0, a resistor R1 provided in parallel with the capacitor C0, and a capacitor C1 as a secondary filter. The resistor R1 and capacitors C0 and C1 make use of elements formed in a semiconductor chip.

In the PLL circuit according to the present embodiment, a changeover or selector switch 18 capable of supplying a substantially intermediate constant voltage VDC of the control voltage Vt in place of the output current of the charge pump, and an auto band selection circuit 20 which compares the output of the variable divider 12 and the output of the constant divider 14 and thereby generates a signal for switching or selecting a band to be used for the VCO 11 are provided between the charge pump 16 and the loop filter 17. Incidentally, although the phase comparator 15 and the charge pump 16 are illustrated as discrete circuits in the present embodiment, there is also known such a circuit that the output stage of the phase comparator 15 is operated as a current source of the charge pump depending upon a circuit form. Therefore, the charge pump becomes unnecessary in such a case.

The auto band selection circuit 20 comprises a frequency counter 21 which serves as a timer which counts the reference oscillation signal φr supplied from the reference oscillator 13 to thereby perform clocking, a discrimination circuit 22 which compares the output φ1 of the variable divider 12 and the output φr' of the constant divider 14 and determines whether the phase of the output φ1 of the variable divider 12 leads the phase of the output φr' of the constant divider 14, a band switching circuit 23 which produces band changeover or switching control signals VB0 through VB7 for performing switching between bands for the VCO 11 according to the result of determination by the discrimination circuit 22, a register 24 which holds the generated band switching control signals VB0 through VB7, a delay compensating circuit 25 which serves as a timing control means that measures a signal delay and applies a delay to each signal, a control circuit 26 which operates the selector switch 18, frequency counter 21, discrimination circuit 22, band switching circuit 23, register 24 and delay compensating circuit 25 in a predetermined order to thereby decide a band to be used, etc.

The control circuit 26 is configured so as to have the function of generating a reset signal RT for resetting the frequency counter 21 and generating a reset signal RES for resetting the variable divider 12. A level converting circuit 19, which converts the reset signal RES to a signal from a CMOS level to an ECL level, is provided between the control circuit 26 and the variable divider 12.

Figure 4:
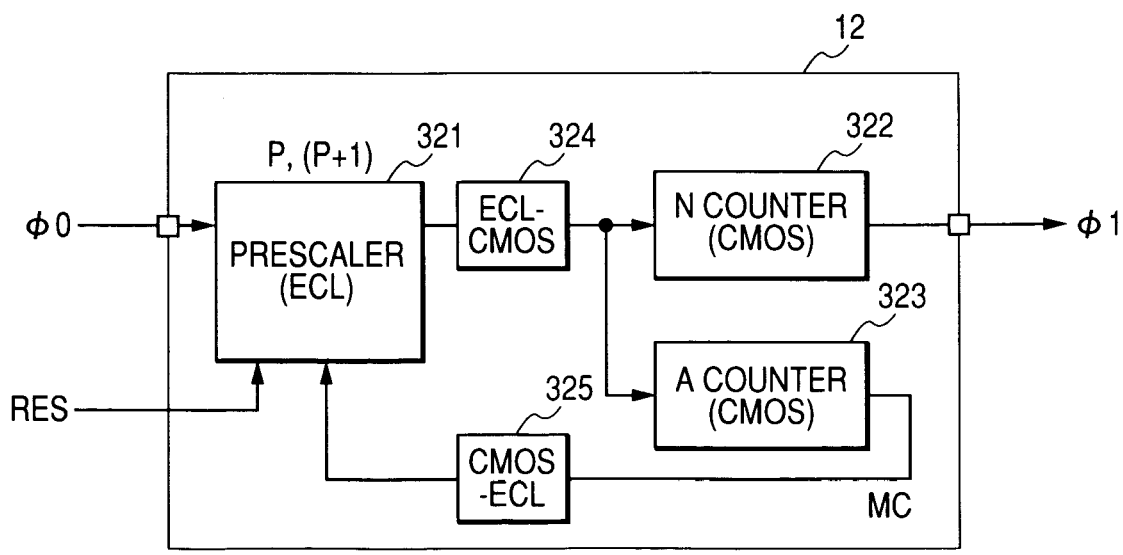
FIG. 4 is a circuit configurational diagram showing a specific example of a variable divider.

The level converting circuit 19 is provided because in the present embodiment as shown in FIG. 4, the variable divider 12 is made up of a prescaler 321 and counters 322 and 323, and the prescaler 321 is constituted of an ECL circuit using a bipolar transistor for speeding up. The delay compensating circuit 25 is provided to avoid that the reset signal RES supplied from the control circuit 26 to the variable divider 12 is delayed due to a propagation delay of a signal path and a gate delay of the level converting circuit 19 so that the phase of the output φ1 of the variable divider 12 is shifted correspondingly, thus disabling proper discrimination.

Incidentally, the N counters 322 and the A counter 323 provided at a stage subsequent to the prescaler 321 are respectively constituted of CMOS circuits in the variable divider 12 shown in FIG. 4. The frequency counter 21 and constant divider 14 are also respectively constituted of CMOS circuits. This is because since the frequency of an oscillation signal of the VCO 11 to be divided by the prescaler 321 is on the order of GHz (Gigahertz), its division cannot be done unless a high-speed ECL circuit is used, whereas since the signal to be divided by the N counter 322 and the A counter 323 is of a signal ranging from a few tens of MHz to a few hundred of MHz divided by the prescaler 321, and the reference signal φr to be divided by the constant divider 14 is no more than the signal of 26 MHz, the CMOS circuits are capable of performing its division sufficiently.

Figure 2:
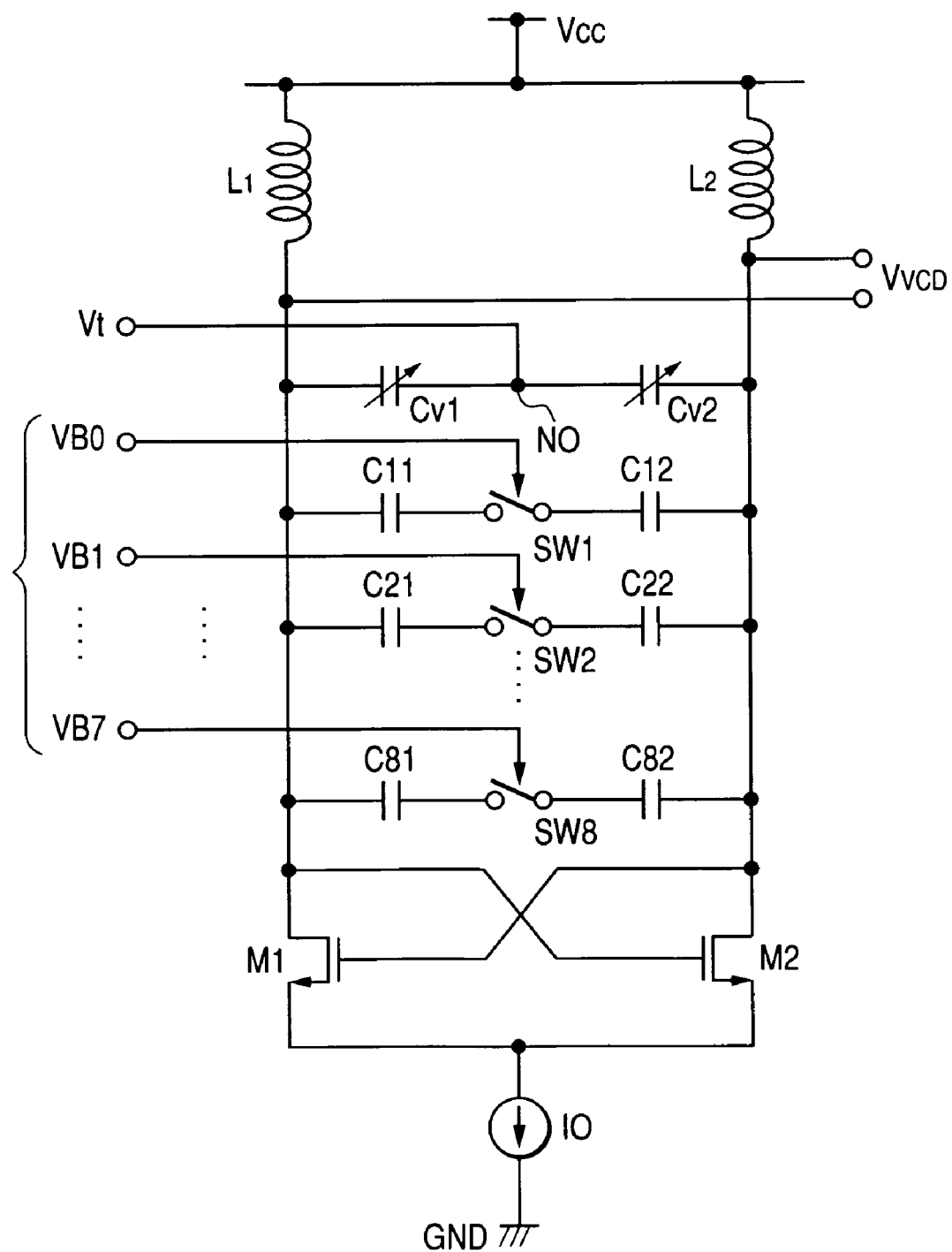
FIG. 2 is a circuit diagram illustrating one embodiment of a VCO (Voltage-Controlled Oscillator) that constitutes the PLL circuit shown in FIG. 1.

A configurational example of the voltage-controlled oscillator (VCO) 11 employed in the present embodiment is shown in FIG. 2.

The VCO employed in the present embodiment is of an LC resonant oscillator circuit, which comprises a pair of N channel MOS transistors M1 and M2 of which the sources are connected in common and the gates and drains are cross-connected to one another, a constant current source I0 connected between the common sources of the transistors $M_1$ and $M_2$ and a ground point GND, inductors L1 and L2 respectively connected between the drains of the transistors M1 and M2 and a power supply voltage terminal Vcc, variable capacitive elements Cv1 and Cv2 made up of varactor diodes or the like series-connected between the drain terminals of the transistors M1 and M2, and a capacitor C11—a switch SW1—a capacitor C12 series-connected between the drain terminals of the transistors M1 and M2, and a capacitor C21—a switch SW2—a capacitor C22, a capacitor C31—a switch SW3—a capacitor C32, . . . a capacitor C81—a switch SW8—a capacitor C82 connected in parallel with the C11—SW1—C12.

In the VCO employed in the present embodiment, the control voltage Vt supplied from the loop filter 17 of FIG. 1 is applied to a connecting node NO of the variable capacitive elements Cv1 and Cv2 to continuously change the oscillation frequency. On the other hand, the band switching control signals VB0 through VB7 outputted from the auto band selection circuit 20 are supplied to the switches SW1 through SW8. The VB0 through VB7 are respectively brought to either a high level or a low level, whereby the oscillation frequency is changed stepwise (256 stages or levels).

The capacitors C11 and C12 are identical in capacitance value. The capacitors C21 and C22, the capacitors C31 and C32, the capacitors C41 and C42, the capacitors C51 and C52, the capacitors C61 and C62, the capacitors C71 and C72, and the capacitors C81 and C82 are also respectively identical in capacitance value. However, the capacitance values of the capacitors C11, C21, C31, C41, C51, C61, C71 and C81 are respectively set so as to have a weight of $2^m$ (where m=0, 1, 2, 3, . . . 7). A composite capacitance C is changed in 256 stages according to combinations of the band switching control signals VB0 through VB7. The VCO 11 is operated based on any of frequency characteristics of bands #0 through #255 corresponding to 256 bands shown in FIG. 3.

Figure 3:
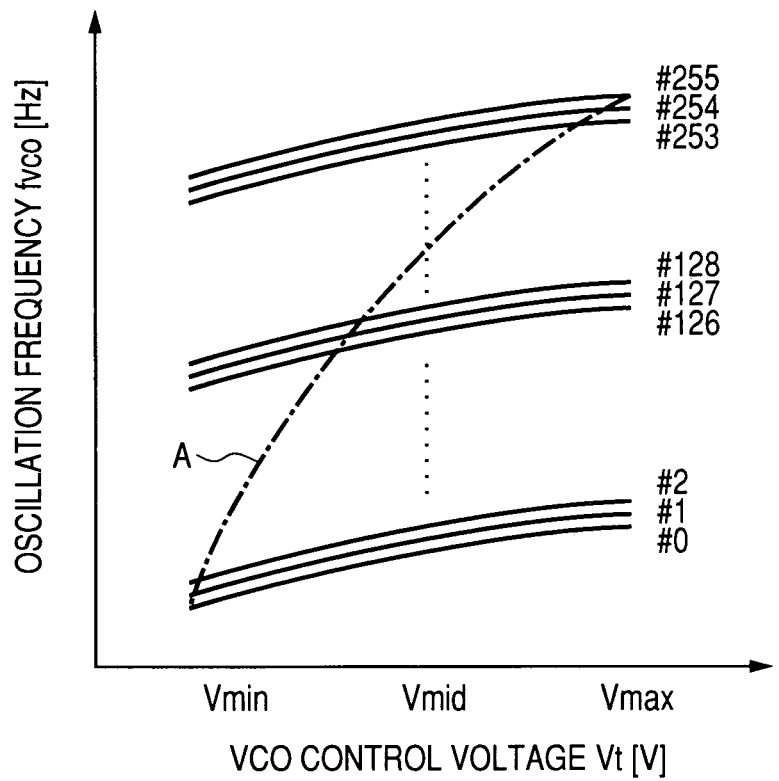
FIG. 3 is a characteristic diagram depicting a relationship between a control voltage Vt and an oscillation frequency fvco employed in the VCO shown in FIG. 2.

When one attempts to widen a frequency range to be covered by the VCO only by changes in capacitance value of the varactor diodes due to the control voltage Vt where it is desired to widen the frequency range, a Vt-fvco characteristic becomes steep as indicated by a chain line A in FIG. 3 and hence the sensitivity of the VCO, i.e., the ratio (Δf/ΔVt) between the amount of change in frequency and the amount of change in control voltage becomes large, so that the oscillation frequency becomes susceptible to noise. That is, the oscillation frequency of the VCO greatly varies by simply placing slight noise on the control voltage Vt.

In order to solve such a problem, the VCO employed in the present embodiment is configured in such a manner that the capacitive elements constituting the LC resonant circuit are provided in parallel in plural form, and the capacitive elements connected by the band switching control signals VB0 through VB7 are switched to the 256 stages to change the value of C, whereby oscillation control according to 256 Vt-fvco characteristic lines is performed as indicated by solid lines in FIG. 3. Further, any characteristic is selected according to the used band to operate the VCO.

In the LC resonant oscillator circuit employed in the present embodiment, the capacitors C11 through C82 are respectively constituted of capacitors each having a sandwich structure of a metal film-insulating film-metal film formed on a semiconductor substrate. By suitably setting an area ratio among electrodes that constitute the capacitors C11 through C82, a desired capacity ratio ($2^m$) can be obtained. The capacitors C11 through C82 are called "band switching capacitances" below. Capacitances between the gate electrodes of the MOS transistors and the substrate may be used as the capacitors C11 through C82. While the inductors L1 and L2 can be formed as on-chip elements each made up of an aluminum layer, which are formed on the semiconductor substrate, external elements may be used.

The variable divider 12 shown in FIG. 4 is configured using a circuit called a modulo counter. That is, the variable divider 12 comprises a prescaler 321 which inputs an oscillation signal φ0 of the VCO11 and divide it into 1/P or 1/(P+1), an N counter 322 and an A counter 323 that constitute a modulo counter, an ECL-CMOS level converting circuit 324 which level-converts a signal outputted from the prescaler 321, and a CMOS-ECL level converting circuit 325 which level-converts a division ratio switching signal MC supplied from the A counter 323 to the prescaler 321.

How to divide the oscillation signal by the modulo counter comprising the prescaler 321 and the N counter 322 and A counter 323 is of the already known technique. The prescaler 321 is configured so as to make it possible to perform two types of divisions different in division ratio as in the case of, for example, a 1/16 division and a 1/17 division. Switching from one division ratio to the other division ratio is performed by a count end signal of the A counter 323. The N counter 322 and the A counter 323 are programmable counters. An integral part obtained by dividing a desired frequency (an oscillation frequency f0 of VCO that desires to obtain as an output) by a frequency fr of a reference oscillation signal φr and a first division ratio (e.g., P=17) of the prescaler 321 is set to the N counter 322, whereas its remainder (MOD) is set to the A counter 323. When the respective counters count the values set thereto, they end their count operations and perform counting of set values again.

When the prescaler 321 and the modulo counter are operated in such a procedure, the prescaler 321 first divides the oscillation signal of the VCO 11 into 1/16. When the A counter 323 counts the output thereof up to a set value, it outputs a count end signal MC so that the operation of the prescaler 321 is switched according to the signal MC. Thus, the prescaler 321 divides the oscillation signal of the VCO 11 into 1/17 until the A counter 323 counts a set value again. With the execution of such an operation, the modulo counter is capable of dividing the oscillation signal at a ratio having a decimal fraction without using an integral ratio.

A procedure for deciding a band to be selected by the auto band selection circuit 20 employed in the PLL circuit shown in FIG. 1 will next be explained using a timing chart shown in FIG. 5.

When a signal OFC for instructing the control circuit 26 to switch an oscillation frequency is supplied from outside, a switch changeover signal SC for switching the selector switch 18 on a PLL loop to a constant voltage VDC and a signal RT for resetting the frequency counter 21 are outputted from the control circuit 26. Further, a division ratio "N" of the variable divider 12, which has been supplied from outside, is set to the variable divider 12 (timing t1). This division ratio corresponds to oscillation frequency information. When the selector switch 18 is changed to the constant voltage VDC, the constant voltage VDC is supplied to the VCO 11 as a control voltage Vt and hence the VCO 11 starts oscillating with a frequency corresponding to the constant voltage VDC.

After the input of the reset signal RT, the frequency counter 21 starts a count operation in accordance with an accurate oscillation signal $\phi r$ outputted from the reference oscillator 13. When 5 μs (microseconds) have elapsed, the frequency counter 21 sends an elapse signal to the control circuit 26. This 5 μs corresponds to the time required for the voltage of the loop filter 17 to be stabilized at the constant voltage VDC. When 5 μs have elapsed, the control circuit 26 supplies a signal for instructing the VCO band switching circuit 23 to send the band switching control signals VB0 through VB7 to the VCO 11. Thus, the selectively-connected capacitive element, i.e., selected band is designated at the VCO 11 (timing t2). The band initially designated here corresponds to a central band #127 of 256 bands #0 through #255.

Next, the control circuit 26 waits a short time (e.g., 0.5 μs) required for band switching of the VCO 11 and thereafter sends a pulse-shaped reset signal RES to the variable divider 12 and the constant divider 14. The variable divider 12 and the constant divider 14 are counter circuits. The variable divider 12 and the constant divider 14 are temporarily reset to "0" by the reset signal RES and released from resetting, followed by starting counting. When the variable divider 12 and the constant divider 14 count the set division ratio "N" and "65", they output pulses $\phi 1$ and $\phi r'$. Since the constant divider 14 is operated by the accurate reference oscillation signal $\phi r$ (26 MHz) outputted from the reference oscillator 13, the frequency of the output pulse $\phi r'$ is 400 kHz and its cycle corresponds to 2.5 μs. These output pulses $\phi 1$ and $\phi r'$ are supplied to the lead/lag discrimination circuit 22. The lead/lag discrimination circuit 22 discriminates whether the rising edge of the output pulse $\phi 1$ of the variable divider 12 leads the rising edge of the output pulse $\phi r'$ of the constant divider 14.

When the phase lead/lag discrimination circuit 22 determines that the output pulse $\phi 1$ of the variable divider 12 lags, the lead/lag discrimination circuit 22 supplies, to the VCO band switching circuit 23, a signal for instructing the VCO band switching circuit 23 to send band switching control signals VB0 through VB7 for designating a band for a frequency higher than at present to the VCO 11 (timing t3). On the other hand, when it is determined that the output pulse $\phi 1$ of the variable divider 12 leads, the phase lead/lag discrimination circuit 22 supplies to the VCO band switching circuit 23, a signal for instructing the VCO band switching circuit 23 to send band switching control signals VB0 through VB7 for designating a band for a frequency lower than at present to the VCO 11. The band designated by the band switching control signals VB0 through VB7 corresponding to the second time corresponds to the middle #191 between #127 and #255 when $\phi 1$ lags, whereas when $\phi 1$ leads, the band corresponds to the middle #63 between #127 and #0.

When the band switching command is executed, the control circuit 26 waits a short time (e.g., 0.5 μs) required to perform the band switching of the VCO 11 and thereafter sends a reset signal RES to the variable divider 12 and the constant divider 14 again. In doing so, the variable divider 12 and the constant divider 14 are temporarily reset to "0" and restarts counting. When the variable divider 12 and the constant divider 14 count the set division ratio "N" and "65" respectively, they output pulses $\phi 1$ and $\phi r'$. The lead/lag discrimination circuit 22 discriminates whether the rising edge of the output pulse $\phi 1$ of the variable divider 12 leads the rising edge of the output pulse $\phi r'$ of the constant divider 14.

When the phase lead/lag discrimination circuit 22 determines that the output pulse $\phi 1$ of the variable divider 12 lags, the lead/lag discrimination circuit 22 supplies, to the VCO band switching circuit 23, a signal for instructing the VCO band switching circuit 23 to send band switching control signals VB0 through VB7 for designating a band for a frequency higher than at present to the VCO 11 (timing t4). On the other hand, when it is determined that the output pulse $\phi 1$ of the variable divider 12 leads, the phase lead/lag discrimination circuit 22 supplies to the VCO band switching circuit 23, a signal for instructing the VCO band switching circuit 23 to send band switching control signals VB0 through VB7 for designating a band for a frequency lower than at present to the VCO 11. The bands designated by the band switching control signals VB0 through VB7 corresponding to the third time correspond to the middle #159 between #127 and #191, the middle #123 between #191 and #255, the middle #95 between #127 and #63 or the middle #31 between #63 and #0. The corresponding band suitable for the designated oscillation frequency (frequency corresponding to the set division ratio N) is selected from the 256 bands by repeating the above operations eight times (timing t5).

In the auto band selection circuit employed in the present embodiment, the selection band of the VCO 11 is switched and the selector switch 18 is switched from the constant voltage VDC side to the output terminal side of the charge pump 16 to close the PLL loop without resetting the variable divider 12 after the eighth discrimination, whereby the VCO 11 is caused to change or migrate into a state for allowing the VCO 11 to perform feedback control.

In the general control method of PLL, the variable divider 12 is reset when the band to be used is decided and the band switching control signals VB0 through VB7 are supplied to the VCO 11 to set the corresponding band. However, in the system that the reset timing of the variable divider 12 is delayed as in the PLL circuit of the present embodiment, there is a fear that when the variable divider 12 is reset where the band of the VCO is set, the reset of the variable divider 12 is delayed, so that a charge-up signal is outputted from the phase comparator 15 to substantially shift the control voltage Vt of the VCO, thereby making longer a time interval necessary for frequency-locking of PLL. On the other hand, since the selector switch 18 is switched without resetting the variable divider circuit 12 after the eighth discrimination in the present embodiment, the switch is changed over while the state of the loop in band selection operation is being held. As a result, an advantage is brought about that the time necessary for the frequency locking of PLL becomes short.

Figure 6A:
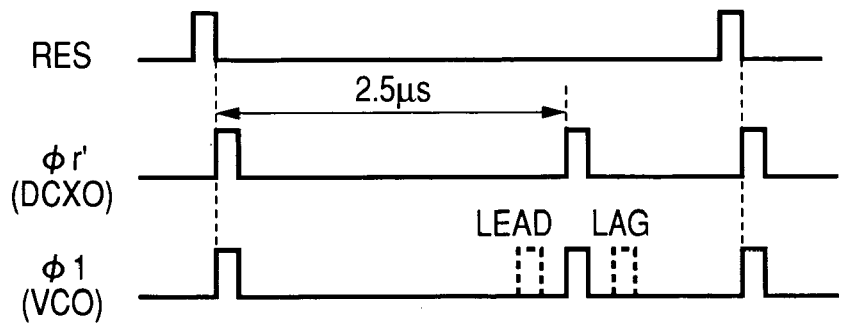
FIGS. 6(A), 6(B) and 6(C) are respectively timing charts illustrating a reset signal at band selection of a PLL circuit discussed prior to the present invention and output timings of ideal variable and constant dividers thereof, showing a reset signal at band selection of a pre-countermeasure PLL circuit and output timings of a variable divider and a constant divider thereof, and depicting a reset signal at band selection of a PLL circuit according to a post-countermeasure embodiment and output timings of a variable divider and a constant divider thereof.
Figure 6B:
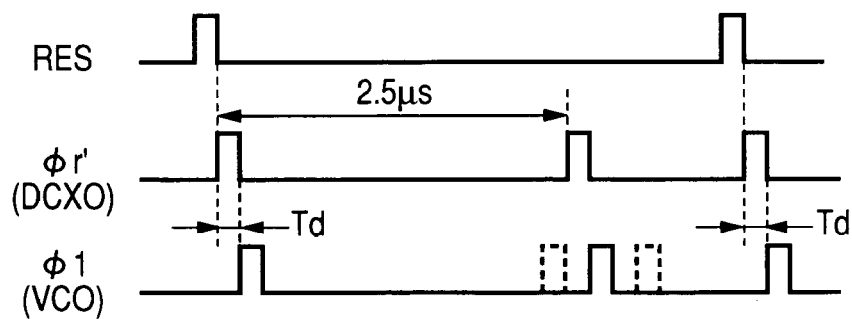
Figure 6C:
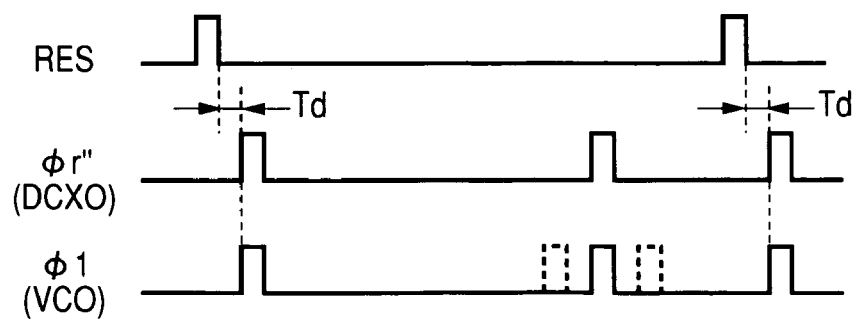
Figure 7:
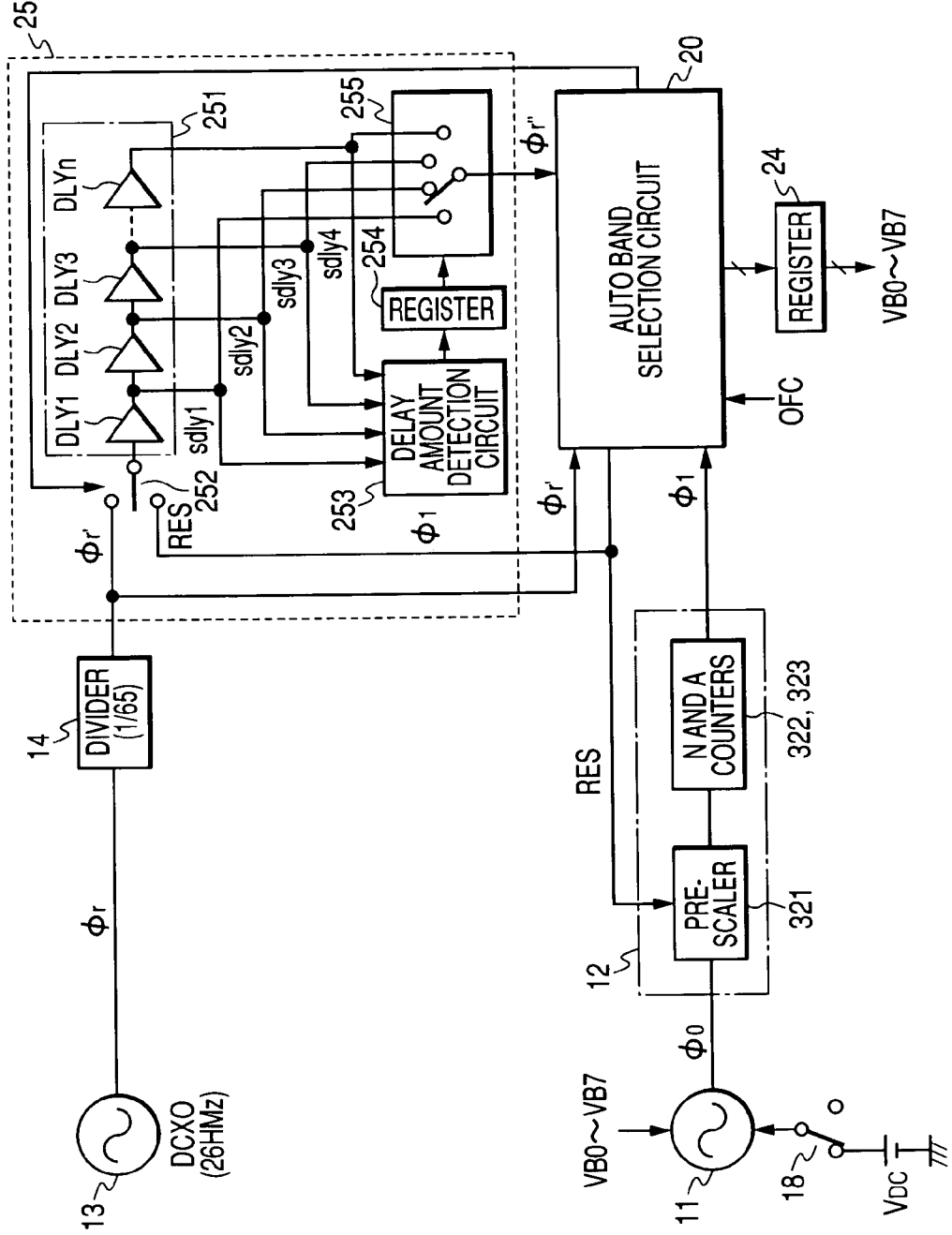
FIG. 7 is a circuit configurational diagram showing a specific example of a delay compensation circuit.

A first embodiment of the delay compensating circuit 25 is shown in FIG. 7. Prior to the description of the configuration and operation of the delay compensating circuit 25 shown in FIG. 7, the reason why the delay compensating circuit 25 is provided, will be explained using a timing chart shown in FIG. 6.

In the auto band selection circuit employed in the embodiment, in which the phase lead/lag discrimination circuit 22 determines whether the rising edge of the output pulse φ1 of the variable divider 12 leads the rising edge of the output pulse φr' of the constant divider 14, the rising edge of the output pulse φr' of the constant divider 14 and the rising edge of the output pulse φ1 of the variable divider 12 coincide with each other upon resetting by the reset signal RES as shown in FIG. 6(A) where no delay occurs in the reset operation of the variable divider 12. It is therefore possible to accurately determine whether the phase processed after 2.5 μs leads or lag.

On the other hand, when a delay occurs in the reset operation of the variable divider 12, the rising edge of the output pulse φ1 of the variable divider 12 is already delayed by Td than the rising edge of the output pulse φr' of the constant divider 14 upon resetting. It is therefore not possible to accurately discriminate whether the phase leads or lags. That is, when the reset of the variable divider 12 is done with being delayed, the phase lead/lag discrimination circuit 22 determines that the rising edge of the output pulse φ1 is delayed even when the cycle of the output pulse φ1 of the variable divider 12 and the cycle of the output pulse φr' of the constant divider 14 are identical and the selection band at that time should be decided. Thus, the phase lead/lag discrimination circuit 22 instructs the band switching circuit 23 to select a band shorter in cycle (high in frequency).

Thus, in the auto band selection circuit employed in the present embodiment, a delay compensating circuit 25 having such a configuration as shown in FIG. 7 is provided and configured in such a manner that prior to the start of discrimination by the lead/delay discrimination circuit 22, a delay Td of an output pulse φ1 of the variable divider 12 is measured and a signal φr" obtained by delaying an output pulse φr' of the constant divider 14 by the delay Td obtained by its measurement as shown in FIG. 6(C) is inputted to the lead/lag discrimination circuit 22 upon discrimination by the lead/lag discrimination circuit 22 to thereby make a decision as to the lead/lag of the phase thereof. Consequently, the proper discrimination can be made even if some delay occurs in the reset operation of the variable divider 12.

The delay compensating circuit 25 shown in FIG. 7 comprises a signal delay circuit 251 having a plurality of delay stages DLY1 through DLYn connected in series, a selector switch 252 which selectively inputs the signal φr' divided by the constant divider 14 or the reset signal RES outputted from the control circuit 26 to the signal delay circuit 251, a delay amount detection circuit 253 which compares the phases of delay signals Sdly1 through Sdlyn pulled out from the delay stages DLY1 through DLYn of the signal delay circuit 251 and the phase of the signal φ1 divided by the variable divider 12 to thereby detect the delay signal whose phase is closest to the phase of the division signal φ1 from the plural delay signals Sdly1 through Sdlyn and produces and outputs a signal (code) for specifying the delay signal, a register 254 which holds the produced signal, and a selector 255 which selects one of the delay signals Sdly1 through Sdlyn pulled out from the respective delay stages DLY1 through DLYn of the signal delay circuit 251 in accordance with the signal retained in the register 254 and supplies it to the auto band selection circuit 20.

The respective delay stages DLY1 through DLYn of the signal delay circuit 251 respectively comprise 20 buffer circuits like, for example, inverters or ECL circuits, which are connected in series. They have delay amounts substantially identical to one another. Viewed as a whole, that is, the output signal Sdlyn of the delay stage DLYn corresponding to the final stage is set so as to have a delay equivalent to one cycle (e.g., 2.5 μsec) of the division signal φr' with respect to the phase of the input signal.

The delay amount detection circuit 253 can be constituted of, for example, such a dynamic type decoder that it receives the division signal φ1 of the variable divider 12 as an enable signal and decodes the delay signals Sdly1 through Sdlyn outputted from the delay stages DLY1 through DLYn at the time that the signal changes to a high level, or a logic circuit comprising n AND gates of such a type that the delay signals Sdly1 through Sdlyn outputted from the delay stages DLY1 through DLYn are respectively set as one inputs and the division signal φ1 of the variable divider 12 is set as the other common input, (n−1) exclusive OR gates in which the outputs of the AND gates adjacent to one another are set as their inputs, etc.

Incidentally, the auto band selection circuit 20 shown in FIG. 7 is equivalent to one in which a circuit comprising the circuit blocks (21, 22, 23 and 26) excluding the register 24 and the delay compensating circuit 25, of the circuit block corresponding to a portion surrounded by reference numeral 20 in FIG. 1 is represented as one block. The auto band selection circuit 20 is activated only during an auto band selecting operation by the control signal OFC and brought to a non-operating state after a band selection has been completed and decided band information VB0 through VB7 have been retained in the register 24. The delay compensating circuit 25 is operated even after the auto band selecting operation period has been completed, and the signal φr" delayed by the delay compensating circuit 25 is supplied to the phase comparator 15 of the PLL loop.

Figure 8:
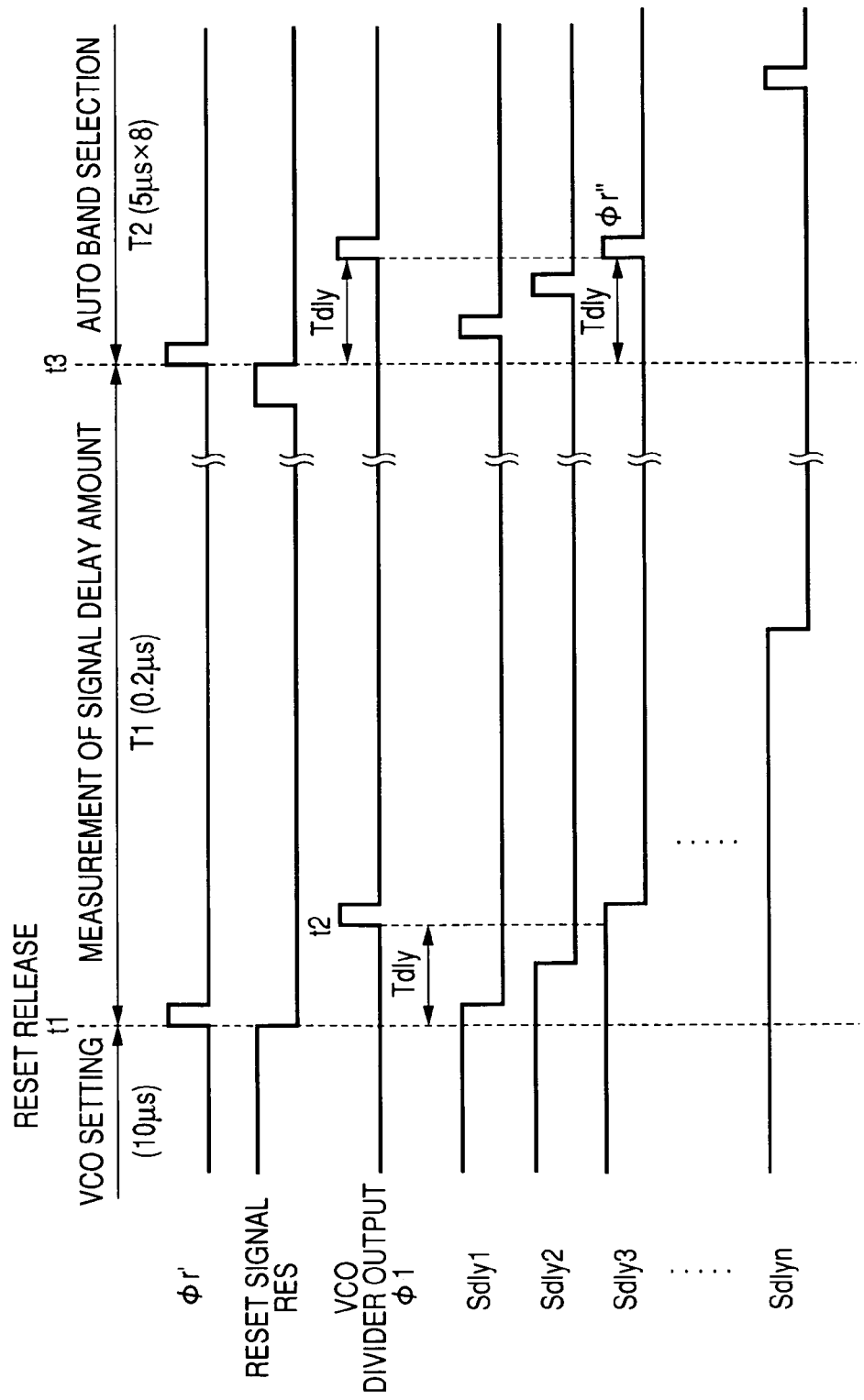
FIG. 8 is a timing chart illustrating timings provided for signals at delay amount measurements and band selection in the delay compensation circuit shown in FIG. 7.

The operation of the delay compensating circuit 25 of FIG. 7 will next be explained using a timing chart shown in FIG. 8. The delay compensating circuit 25 shown in FIG. 7 changes the reset signal RES from a high level to a low level in a state in which before a substantial auto band selection is started, the selector switch 252 has first been switched to the side for selecting a reset signal RES, and measures a delay time Tdly (t1-t2) taken until the division signal φ1 of the variable divider 12 is inputted. Here, the reset signal RES is generated by the auto band selection circuit 20 in sync with the division signal φr' outputted from the constant divider 14. Therefore, if a delay signal, which changes from a high level to a low level is found out, of the delay signals Sdly1 through Sdlyn outputted from the delay stages DLY1 through DLYn when the division signal φ1 of the variable divider 12 is changed to a high level, it is possible to recognize a delay time Tdly of the division signal φ1 of the variable divider 12 with respect to the division signal φr' of the constant divider 14.

The delay amount detection circuit 253 detects a delay stage DLYx corresponding to a delay signal that changes from a high level to a low level when φ1 of the signals at the delay stages DLY1 through DLYn changes to the high level, and generates and outputs such a control signal as to select a signal at the delay stage DLYx through the selector 255 at its subsequent stage and supply it to the auto band selection circuit 20. Its output is retained in the register 254. Thereafter, the auto band selection of the VCO 11 by the auto band selection circuit 20 is started.

Upon the auto band selection, the selector switch 252 is switched to the side for selecting the division signal φr' of the constant division circuit 14, so that the signal φr' is inputted to the delay stages DLY1 through DLYn, where it is delayed. At this time, the control signal corresponding to the result (Tdly) obtained by an immediately-preceding delay time measurement has been held in the register 254. The output of the delay stage DLYx corresponding to the measured delay time Tdly, of the delay stages DLY1 through DLYn is selected by the selector 255 and supplied to its corresponding phase lead/lag discrimination circuit 22 lying within the auto band selection circuit 20 as a comparison signal φr". As a result, the comparison signal φr" supplied to the phase lead/lag delay discrimination circuit 22 subsequent to reset release becomes a signal substantially synchronized with the division signal φ1 of the variable divider 12 as indicated by a period T of FIG. 8, so that an accurate decision as to the lead/lag of its phase is made possible. Incidentally, the switching signal of the selector switch 252 is supplied from the control circuit 26 shown in FIG. 1.

Figure 9:
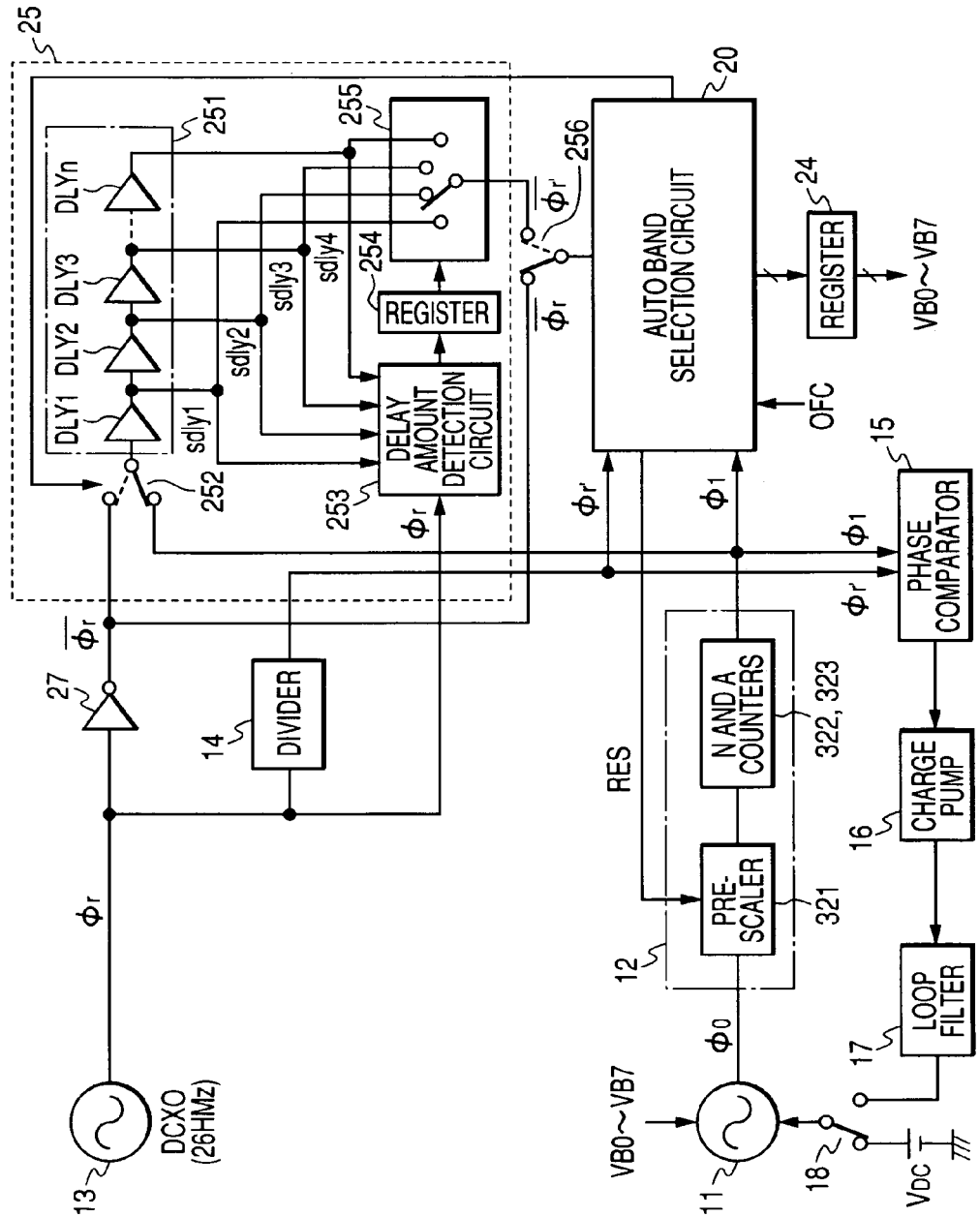
FIG. 9 is a circuit configurational diagram depicting another specific example of a delay compensation circuit.

A second embodiment of a delay compensating circuit 25 is shown in FIG. 9. In FIG. 9, the same circuits as those in the delay compensating circuit 25 shown in FIG. 7 are given the same reference numerals and their dual explanations are therefore omitted.

The delay compensating circuit 25 shown in FIG. 9 is configured in such a manner that a signal φ1 divided by a variable divider 12 and a signal/φr obtained by inverting a pre-division oscillation signal φr of a DCXO 13 by an inverter 27 are selectively inputtable to a signal delay circuit 251 by a switch 252 in place of the reset signal RES and the signal φr' divided by the constant divider 14, respectively. The delay compensating circuit 25 is provided with a selector switch 256 for selecting either the oscillation signal φr outputted from the DCXO 13 or a signal/φr' delayed by the signal delay circuit 251 and supplying it to an auto band selection circuit 20. The auto band selection circuit 20 is configured so as to generate a reset signal RES of the variable divider 12 on the basis of either the oscillation signal φr or the delay signal/φr'.

Further, in the delay compensating circuit 25 according to the present embodiment, the oscillation signal φr outputted from the DCXO 13 is supplied to a delay amount detection circuit 253 in place of the signal φ1 divided by the variable divider 12. The delay amount detection circuit 253 compares the phases of the oscillation signal φr and delay signals Sdly1 through Sdlyn pulled out from respective delay stages DLY1 through DLYn of the signal delay circuit 251, detects the delay signal closest to the rising edge of the oscillation signal φr, of the plural delay signals Sdly1 through Sdlyn, and produces a signal (code) for specifying the delay signal and outputs it to a register 254.

The operation of the delay compensating circuit 25 shown in FIG. 9 will next be explained using a timing chart shown in FIG. 10. The delay compensating circuit 25 shown in FIG. 9 starts the measurement of a delay time in a state in which prior to the start of a substantial auto band selection, the selector switch 256 has first been switched to the side for selecting the inverted signal/φr outputted from the inverter 27 and then the selector switch 252 has been switched to the side for selecting the division signal φ1 outputted from the variable divider 12.

Figure 10:
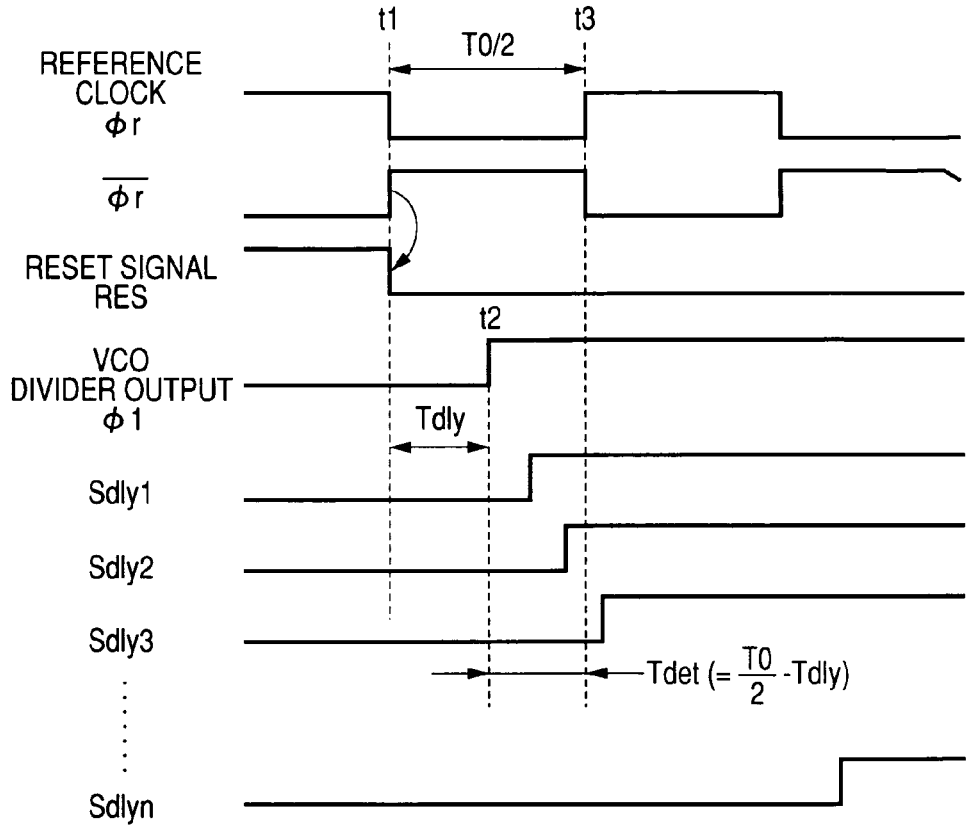
FIG. 10 is a timing chart showing timings provided for signals at the measurement of a delay amount in the delay compensation circuit shown in FIG. 9.

With the switching of the selector switch 256 to the inverted signal/φr side, the reset signal RES is changed to a low level in sync with a change of the inverted signal/φr from a high level to a low level so that the reset of the variable divider 12 is released to start division (timing "t1" of FIG. 10). Further, the selector switch 252 is switched to the side for selecting the division signal φ1 of the variable divider 12 so that signals Sdly1 through Sdlyn obtained by respectively delaying the division signal φ1 by the delay stages DLY1 through DLYn are supplied to a delay amount detection or measuring circuit 253.

Figure 11:
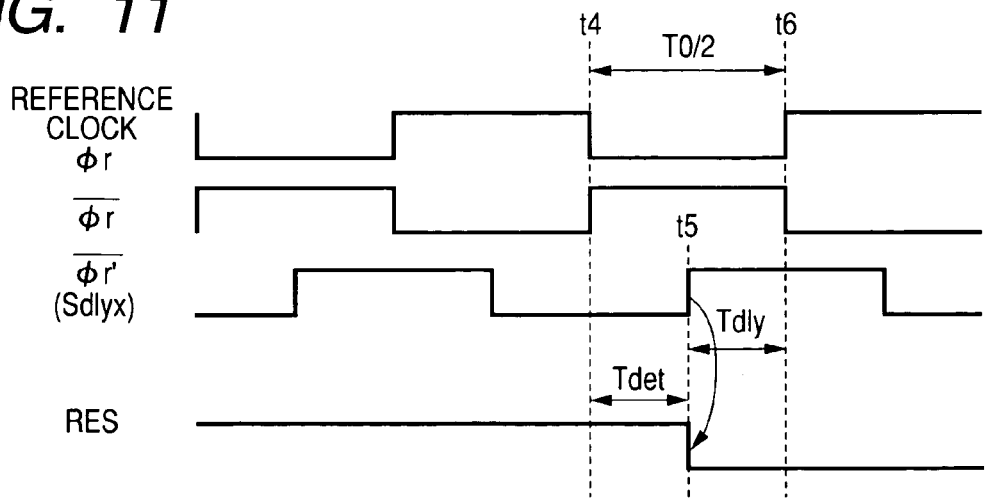
FIG. 11 is a timing chart illustrating timings provided for a reference clock signal and a reset signal at band selection in the delay compensation circuit shown in FIG. 9.

In the present embodiment, since the delay amount measuring circuit 253 determines the outputs of the delay stages DLY1 through DLYn when the oscillation signal Or rises, a result equivalent to a result of measurement of a time from the rising edge of the division signal φ1 to the rising edge of the oscillation signal φr, i.e., a time Tdet from timings "t2" to "t3" of FIG. 10 is obtained. Then, a signal for designating the corresponding delay stage coincident with the timing t3 according to the result of measurement by the delay amount measuring circuit 253 is retained in the register 254. Afterwards, the selector switch 252 is switched to the side for selecting the inverted signal/φr outputted from the inverter 252, and the selector switch 256 is switched to the output of the delay compensating circuit 25, i.e., the sides for the signals Sdly1 through Sdlyn obtained by delaying/φr by the delay stages DLY1 through DLYn Thus, in the auto band selection circuit 20, a reset signal RES is generated in sync with the rising edge of the signal/φr' outputted from the delay compensating circuit 25. Here, the signal/φr' outputted through a selector 255, of the delay signals Sdly1 through Sdlyn outputted from the delay stages DLY1 through DLYn corresponds to a delay signal Sdlyx which rises from the rising edge (timing "t4" of FIG. 11) of the inverted signal/φr with a timing "t5" at which the measured time Tdet has elapsed. In the present delay signal Sdlyx, its rising edge results in a timing earlier than the rising edge (timing "t6" of FIG. 11) of the oscillation signal φr by a delay time Tdly of the division signal φ1 of the variable divider 12 due to a delay of the reset signal RES.

Figure 12:
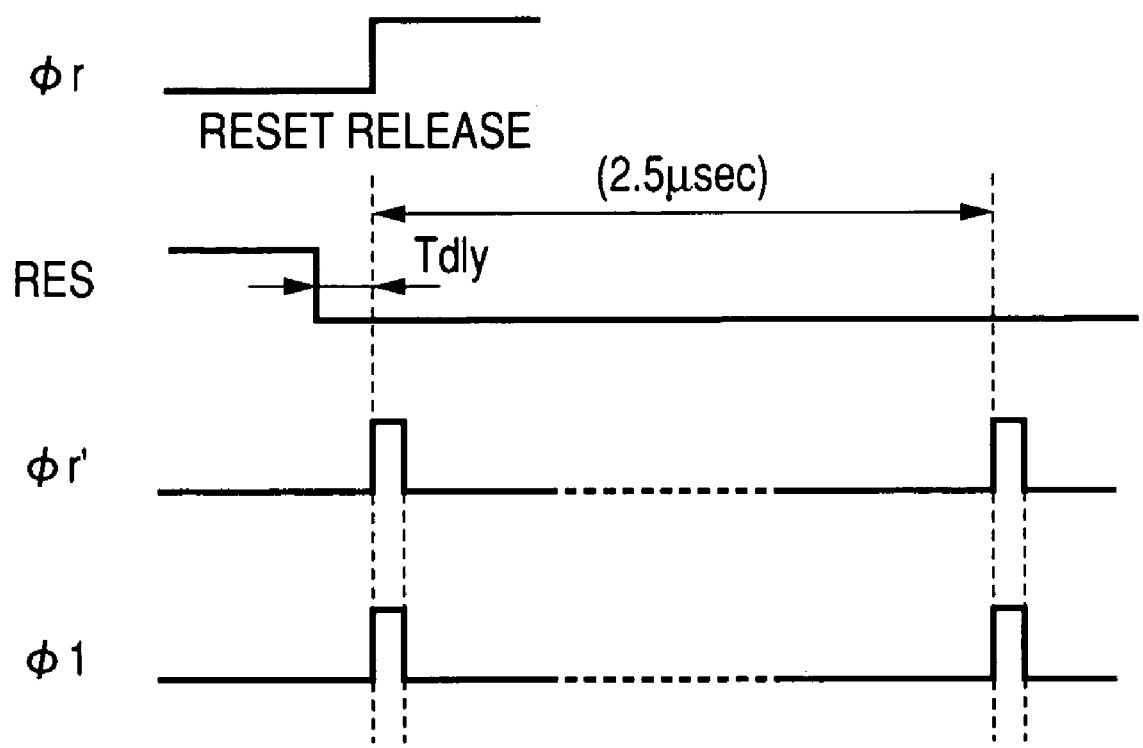
FIG. 12 is a timing chart showing timings provided for signals at band selection in the delay compensation circuit shown in FIG. 9.

That is, according to the present embodiment, the timing provided to change the reset signal RES from the high to low levels can be set ahead only the delay time Tdly than the rising edge of the oscillation signal φr. As a result, as shown in FIG. 12, the phase of the division signal φr' of the constant divider 14 obtained by dividing the oscillation signal φr outputted from the DCXO 13 and the phase of the division signal φ1 of the variable divider 12 obtained by dividing the oscillation signal of the VCO 11 can be made coincident with each other. Consequently, an accurate decision as to phase lead/lag at the auto band selecting operation of the VCO 11, which is done subsequently, can be made and hence a high-precision band selection can be performed.

When the delay compensating circuit of the first embodiment (FIG. 7) is applied, the division signal passed through the delay circuit 251 comprising the delay stages DLY1 through DLYn is supplied to the phase comparator 15. Therefore, when the phase comparator 15 is made up of an analog circuit, noise is placed on the division signal at the delay stages DLY1 through DLYn, so that an accurate phase comparison becomes difficult. On the other hand, when the delay compensating circuit of the second embodiment (FIG. 9) is applied, an advantage is brought about in that since the division signal does not pass through the delay stages DLY1 through DLYn, no noise is carried on the division signal and hence an accurate phase comparison at the phase comparator 15 can be made as compared with the first embodiment.

One configurational example illustrative of a semiconductor integrated circuit for wireless communication (high-frequency IC), which is effective if the PLL circuit equipped with the auto band selecting function of the above embodiment is applied thereto, and a wireless communication system using the semiconductor integrated circuit, will next be explained using FIG. 13.

Figure 13:
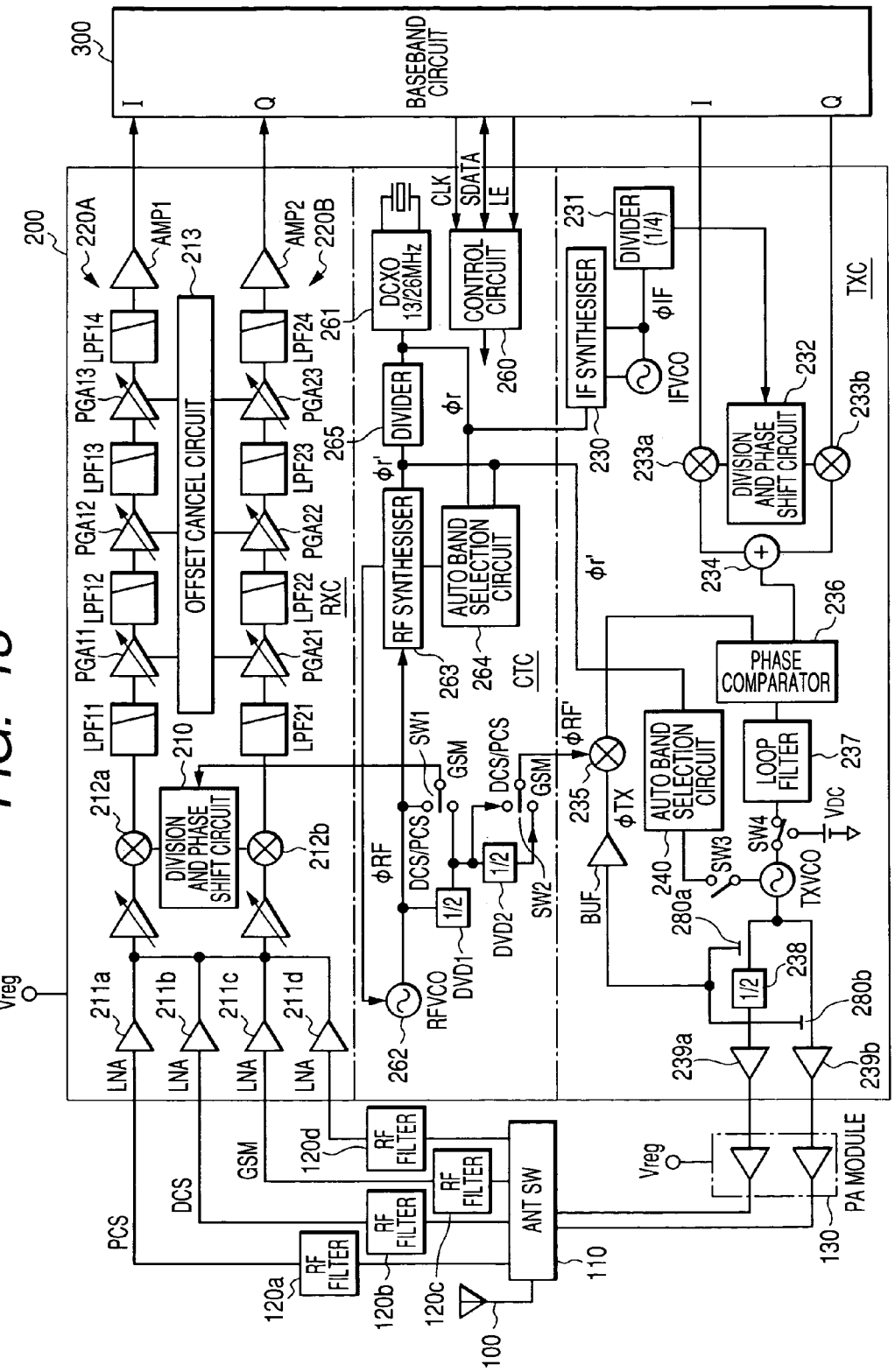
FIG. 13 is a block diagram depicting a configurational example illustrative of a semiconductor integrated circuit for wireless communication (high-frequency IC) to which a PLL circuit according to the present invention is applied, and a wireless communication system using the semiconductor integrated circuit.

As shown in FIG. 13, the system comprises an antenna 100 for transmitting and receiving a signal wave, an antenna switch 110, high-frequency filters 120a through 120d comprising SAW filters or the like which eliminate unnecessary waves from a received signal, a high-frequency power amplifier circuit (power module) 130 which amplifies a transmit signal, a high-frequency IC 200 which demodulates the received signal and modulates the transmit signal, a baseband circuit 300 which performs baseband processing such as conversion of an audio signal or a data signal to be transmitted to an I signal corresponding to a component in phase with a basic wave and a Q signal corresponding to a quadrature component, conversion of the demodulated receive I and Q signals into an audio signal or a data signal, etc. and which transmits signals for controlling the high-frequency IC 200, etc. The high-frequency IC 200 and the baseband circuit 300 are respectively configured on discrete semiconductor chips as semiconductor integrated circuits.

Although not restricted in particular, the high-frequency IC 200 according to the present embodiment is configured so as to be capable of modulating and demodulating signals lying in four frequency bands according to three communication systems of GSM900, DCS1800 and PCS1900. Correspondingly, the high-frequency filters are provided with the filter 120a which causes receive signals lying in the frequency band of PCS1900 to pass therethrough, the filter 120b which causes receive signals lying in the frequency band of DCS1800 to pass therethrough, and the filters 120c and 120d which cause receive signals lying in the frequency bands of the GSM systems to pass therethrough.

If divided broadly, then the high-frequency IC 200 comprises a reception-system circuit RXC, a transmission-system circuit TXC and a control-system circuit CTC comprising circuits common to a transmit-receive system, such as a control circuit, a clock generator, etc. other than the RXC and TXC.

The reception-system circuit RXC comprises low-noise amplifiers 211a, 211b, 211c and 211d which respectively amplify the receive signals lying in the respective frequency bands of PCS, DCS and GSM, a division and phase shift circuit 210 which divides a local oscillation signal φRF generated by a high-frequency oscillator (RFVCO) 262 to generate quadrature signals 90° out of phase with one another, mixers 212a and 212b which mix the receive signals amplified by the low-noise amplifiers 211a, 211b, 211c and 211d with the quadrature signals generated by the division and phase shift circuit 210 to thereby perform demodulation and down-conversion thereof, high-gain amplifying sections 220A and 220B which respectively amplify the demodulated I and Q signals and output them to the baseband circuit 300, an offset cancel circuit 213 for canceling input DC offsets of amplifiers lying in the high-gain amplifying sections 220A and 220B, etc. The reception-system circuit RXC of the high-frequency IC 200 according to the present embodiment adopts a direct conversion system which directly down-converts receive signals into signals lying in a frequency band corresponding to a baseband.

The high-gain amplifying section 220A has a configuration in which a plurality of low-pass filters LPF11, LPF12, LPF13 and LPF14 and gain control amplifiers PGA11, PGA12 and PGA13 are alternately connected in series form and an amplifier AMP1 is connected to the final stage. The high-gain amplifying section 220A amplifies the demodulated I signal and outputs it to the baseband circuit 300. In a manner similar to above, the high-gain amplifying section 220B also has a configuration in which a plurality of low-pass filters LPF21, LPF22, LPF23 and LPF24 and gain control amplifiers PGA21, PGA22 and PGA23 are alternately connected in series form and an amplifier AMP2 is connected to the final stage. The high-gain amplifying section 220B amplifies the demodulated Q signal and outputs it to the baseband circuit 300.

The offset cancel circuit 213 comprises AD converters (ADC) which are provided corresponding to the gain control amplifiers PGA11 through PGA23 and convert differences in potential among the outputs of the gain control amplifiers PGA11 through PGA23 in a state in which input terminals are short-circuits thereamong, into digital signals, DAC converters (DAC) which generate such input offset voltages as to bring DC offsets of the outputs of the corresponding gain control amplifiers PAG11 through PAG23 to "0" on the basis of the results of conversion by these AD converters and give them to differential inputs, a control circuit which controls these AD converters (ADC) and DA converters (DAC) to cause them to perform offset cancel operations, etc.

The control-system circuit CTC includes a control circuit (control logic) 260 which controls the whole chip, a reference oscillator (DCXO) 261 which generates an oscillation signal φr used as the reference, a high frequency oscillator (RFVCO) 262 used as a local oscillator which generates a high frequency oscillation signal φRF for frequency conversion, an RF synthesizer 263 which constitutes a PLL circuit together with the high frequency oscillator (RFVCO) 262, an auto band selection circuit 264 which performs a band selection in response to a division signal supplied from a divider in the RF synthesizer 263 upon the start of reception, a constant divider 265 which divides the oscillation signal φr of the reference oscillator (DCXO) 261 at a division ratio like ⅛₅ to generate a signal φr' like 400 kHz, dividers DVD1 and DVD2 which respectively divide the oscillation signal φRF generated by the RFVCO 262, mode selector switches SW1 and SW2, etc.

Each of the switches SW1 and SW2 switches connecting states in a GSM mode for performing transmission/reception in accordance with the GSM system and a DCS/PSC mode for performing transmission/reception in accordance with the DCS or PCS system and selects a division ratio for a signal to be transferred. These switches SW1 and SW2 are respectively controlled by signals supplied from the control circuit 260.

The control circuit 260 is supplied with a synchronizing clock signal CLK, a data signal SDATA, and a load enable signal LEN used as control signal, which are transferred from the baseband circuit 300. When the load enable signal LEN is asserted to an effective level, the control circuit 260 sequentially takes in the data signal SDATA transferred from the baseband circuit 300 in sync with the clock signal CLK and generates control signals for the inside of the chip in accordance with commands contained in the data signal SDATA. Although not restricted in particular, the data signal SDATA is transferred serially.

Incidentally, since the reference oscillation signal φr requires high frequency accuracy, an external crystal resonator is connected to the reference oscillator 261. A frequency like 26 MHz or 13 MHz is selected as the reference oscillation signal φr. A crystal resonator for such a frequency is a general-purpose part and easily available. The RF synthesizer 263 is made up of a divider circuit, a phase comparator, a charge pump, a loop filter, etc.

The transmission-system circuit TXC comprises an oscillator IFVCO which generates an oscillation signal φIF having an intermediate frequency like, for example, 640 MHz, an IF synthesizer 230 which includes a divider, a phase comparator, a charge pump, a loop filter, etc. and constitutes a PLL circuit for IF together with the IFVCO, a divider 231 which divides the oscillation signal φIF generated by the IFVCO into ¼ to generate a signal like 160 MHz, a division and phase shift circuit 232 which further divides the signal divided by the divider 231 and generates quadrature signals 90° out of phase with each other, quadrature modulators 233a and 233b which modulate the generated quadrature signals by I and Q signals supplied from the baseband circuit 300, an adder 234 which combines the modulated signals, a transmitting oscillator TXVCO which generates a transmit signal φTX having a predetermined frequency, an offset mixer 235 which mixes a signal obtained by extracting the transmit signal φTX outputted from the transmitting oscillator TXVCO by couplers 280a and 280b or the like and feeding back it via a buffer BUF, and a signal φRF' obtained by dividing the high frequency oscillation signal φRF generated by the high-frequency oscillator (RFVCO) 262 used as the local oscillator for generating the oscillation signal for frequency conversion to thereby generate a signal having a frequency equivalent to the difference in frequency between them, a phase comparator 236 which compares the output of the offset mixer 235 and a signal TXIF subjected to modulation/frequency conversion by the quadrature modulators 233a and 233b to thereby detect the difference in phase therebetween, a loop filter 237 which generates a voltage corresponding to the output of the phase comparator 236, a divider 238 which divides the output of the transmitting oscillator TXVCO and uses it as a transmit signal for GSM, transmission output buffers 239a and 239b, etc.

In the present embodiment, the phase comparator 236, the loop filter 237, the transmitting oscillator TXVCO and the offset mixer 235 constitute a transmitting PLL circuit (TX-PLL) which performs frequency conversion. In the present embodiment, the oscillation frequency of the intermediate frequency oscillator (IFVCO) 230 is set to 640 MHz even in the case of any of GSM, DCS and PCS. This is divided into ⅛ by the divider 231 and the division and phase shift circuit 232, so that a carrier wave (TXIF) of 80 MHz is generated to perform modulation.

On the other hand, the oscillation frequency of the high-frequency oscillator (RFVCO) 262 is set to values different from each other in a receiving mode and a transmitting mode. In the transmitting mode, the oscillation frequency fRF of the RFVCO 262 is set to, for example, 3616 to 3716 MHz in the case of GSM850, 3840 to 3980 MHz in the case of GSM900, 3610 to 3730 MHz in the case of DCS and 3860 to 3980 MHz in the case of PCS. This is divided into ¼ in the case of GSM and divided into ½ in the case of DCS and PCS, which in turn is supplied to the offset mixer 235 as φRF'.

The offset mixer 235 outputs a signal equivalent to the difference (fRF'-fTX) between the frequency of the oscillation signal φRF' outputted from the RFVCO 262 and the transmitting oscillation signal φTX outputted from the transmitting oscillator TXVCO. The transmitting PLL (TXPLL) is operated in such a manner that the frequency of this difference signal coincides with the frequency of the modulation signal TXIF corresponding to the output of the adder 234. In other words, the TXVCO is controlled so as to oscillate at a frequency equivalent to the difference (offset) between the frequency (fRF/4 or fRF/2) of the oscillation signal φRF' outputted from the RFVCO 262 and the frequency (fTX) of the modulation signal TXIF. This is the reason why it is called offset PLL.

In the multiband type wireless communication system according to the present embodiment, for example, the control circuit 260 changes the division ratio N of the variable divider lying in the RF synthesizer 263 depending upon a used band and a channel in accordance with a command issued from the baseband circuit 300 upon reception and changes over the switch SW2 according to either the GSM mode or DCS/PCS mode. Thus, the frequency of the oscillation signal supplied to the reception-system circuit RXC or the transmission-system circuit TXC is changed so that switching is done between the frequencies for transmission/reception. Further, the control signals for changing over the selector switches SW1 and SW2 according to frequency bands for transmission/reception are supplied from the control circuit 260 to the switches SW1 and SW2.

In the receiving mode, the oscillation frequency fRF of the RFVCO 262 is set to, for example, 3476 to 3576 MHz in the case of GSM850, 3700 to 3840 MHz in the case of GSM900, 3610 to 3730 MHz in the case of DCS and 3860 to 3980 MHz in the case of PCS. This is divided into ½ by the corresponding divider DVD1 in the case of GSM and supplied to the division and phase shift circuit 210 as it is in the case of DCS and PCS, where it is subjected to division and phase shift, which in turn are supplied to the mixers 212a and 212b as quadrature signals.

Further, the transmission-system circuit TXC of the high-frequency IC 200 according to the present embodiment is provided with an auto band selection circuit 240 which determines a band used for the transmitting oscillator TXVCO. Incidentally, the present auto band selection circuit 240 includes the auto band selection circuit 20 and the variable divider 12 for dividing the oscillation signal of the TXVCO both shown in FIG. 1. An on-off switch SW3 is provided between the auto band selection circuit 240 and the TXVCO, and a selector switch SW4 for selecting either a voltage smoothed by the loop filter or a DC voltage VDC is provided between the loop filter 237 and the TXVCO.

The switch SW3 is brought to an on state by the corresponding control signal from the control circuit 260 upon a used-band selection immediately before the start of transmission. When the band selection is completed, the switch SW3 is brought to an off state. Further, the operation of the auto band selection circuit 240 excluding the register 24 is stopped by the control signal OFC outputted from the control circuit 260. The switch SW4 is changed over to the DC voltage VDC at the band selection, whereas upon transmission, the switch SW4 is changed over to the loop filter 237.

In the high-frequency IC 200 according to the present embodiment, although not restricted in particular, a circuit including the delay compensating circuit 25 of the first embodiment shown in FIG. 7 is applied as the auto band selection circuit 240 for the transmitting TXVCO. Further, a circuit having the delay compensating circuit 25 of the second embodiment shown in FIG. 9 is applied as the auto band selection circuit 264 for the receiving RXVCO.

This is because when the auto band selection circuit provided with the delay compensating circuit 25 of the first embodiment shown in FIG. 7 is used for the band selection of the receiving RXVCO, the signal φr" obtained by delaying, using the delay compensating circuit 25, the signal φr' obtained by dividing the oscillation signal of the DCXO must be supplied to the phase comparator 15 after band decision, and since noise is carried thereon if done so, an accurate phase comparison cannot be performed and at least the delay compensating circuit 25 must be operated even after the band decision, thereby increasing current consumption.

On the contrary, the auto band selection circuit 240 for the transmitting TXVCO can be disconnected from the TXVCO and brought into a stop state after the use band has been decided, and the delay compensating circuit 25 becomes unnecessary. Therefore, the auto band selection circuit of the first embodiment shown in FIG. 7 can be used. On the other hand, the auto band selection circuit provided with the delay compensating circuit 25 of the second embodiment shown in FIG. 9 needs not to delay the division signal φr' by the delay compensating circuit 25. Therefore, it can be applied to both the auto band selection circuit 264 for the RXVCO and the auto band selection circuit 240 for the transmitting TXVCO.

In the second embodiment of FIG. 9, however, the reset signal is raised earlier by a half cycle of the reference oscillation signal φr and the amount of a delay for the division signal φ1 is measured. Therefore, the present embodiment cannot adapt to a delay exceeding the half cycle of the reference oscillation signal φr. On the other hand, even if the reset signal is delayed, the auto band selection circuit of the first embodiment shown in FIG. 7 is able to adapt to its delay by virtue of a delay in the signal φr' obtained by dividing the reference oscillation signal φr. The amount of the delay in the division signal φr' is allowed up to one cycle of the signal φr'.

That is, when the auto band selection circuit of the second embodiment shown in FIG. 9 is used, the condition for the delay with respect to the reset signal of the variable divider 12 becomes rigid as compared with the case in which the auto band selection circuit of the first embodiment shown in FIG. 7 is used. Thus, since the variable divider can be designed roughly where the auto band selection circuit of the first embodiment shown in FIG. 7 is used, and the degree allowable for variations in delay time of the reset signal also becomes large, its use is advantageous in terms of design.

Figures 14A, 14B:
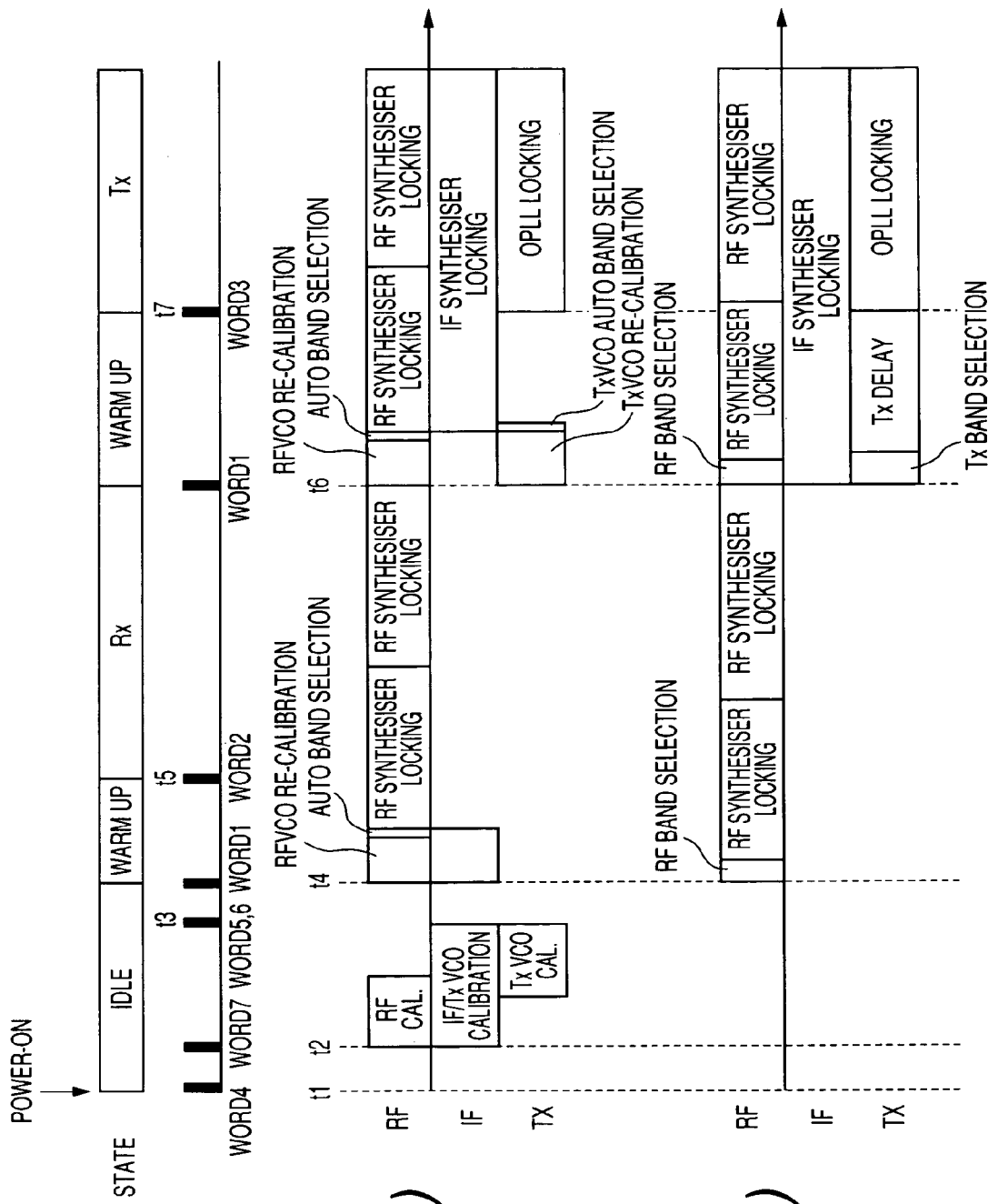
FIG. 14(A) is a timing chart showing timings provided to raise an RFVCO, an IFVCO and a TXVCO in a conventional high-frequency IC.
FIG. 14(B) is a timing chart showing timings provided to raise an RFVCO, an IFVCO and a TXVCO in a high-frequency IC according to the present invention.

A procedure for mode control and raising the respective VCOs by the control circuit of the high-frequency IC having the offset PLL type transmission-system circuit shown in FIG. 13 will next be explained using a timing chart shown in FIG. 14. Incidentally, FIG. 14(A) is a timing chart showing the operations of RFVCO, IFVCO and TXVCO used in the conventional high-frequency IC which perform the frequency measurements of VCO and the band selection based on the measured values thereof, and FIG. 14(B) is a timing chart showing the operations of RFVCO, IFVCO and TXVCO employed in the high-frequency IC of the present embodiment.

When the power of the system is turned on, the supply of the power to the high-frequency IC 200 is started. A command corresponding to, for example, "Word4" is supplied from the baseband IC 300 to the high-frequency IC 200 after the power is up. In doing so, the circuits such as the register, etc. lying inside the high-frequency IC 200 are brought to a reset state by the control circuit 260, so that the high-frequency IC 200 enters an idle mode (sleep state indicative of waiting for command) (timing t1 in FIG. 14). In this condition, the oscillating operations of the respective VCOs have been halted. In the conventional high-frequency IC, the frequency measuring processes (measurement and storage) of the RFVCO and IFVCO in the high-frequency IC 200 are done when a command (Word7) constituted of a predetermined bit code for instructing the measurement of the frequency of the VCO is supplied from the baseband IC 300 during the idle mode. In the high-frequency IC 200 of the present embodiment, however, nothing is done (timing t2 in FIG. 14).

In the conventional high-frequency IC, the measurements of frequencies for the respective bands of the RFVCO and IFVCO are performed in parallel. Thereafter, the frequency measurement of the transmitting TXVCO using a counter used in the frequency measurement of the IFVCO is performed. Therefore, the frequency measurement of the RFVCO is terminated earlier than its measurement. The baseband IC 300 sends "Word5 and 6" for instructing an initial setting when a suitable time interval has elapsed after the transmission of the measurement start command "Word7" (timing t3 in FIG. 14). When the frequency measurement of the transmitting TXVCO is terminated, its end is notified to the control circuit 260. The control circuit 260 initially sets the inside of the high-frequency IC 200 for the purpose of transmitting and receiving operations after the completion of its measurement.

When the present initial setting is completed, a command "Word1" including a division ratio N (frequency information on channel to be used) of the variable divider or the like is supplied from the baseband IC 300 to the high-frequency IC 200. The control circuit 260 enters a warm up mode for starting the VCO (timing t4 in FIG. 14). A bit for instructing transmission or reception is also contained in the command. The control circuit 260 performs the operation of selecting a band used for the RFVCO 250 on the basis of the frequency information from the baseband according to the bit upon reception. Then, the RFVCO is caused to perform an oscillating operation to bring an RF-PLL loop to a locked state.

Thereafter, when a command "Word2" for instructing a receiving operation is sent from the baseband IC 300, the control circuit 260 enters a receiving mode and operates the reception-system circuit RXC to amplify and demodulate a receive signal (timing t5 in FIG. 14). In the conventional high-frequency IC, when the "Word1" is supplied, the RF synthesizer is locked after the frequency measurement of the RFVCO has been performed. Since the present frequency measurement is effected on all bands, the time required to decide a used band becomes long as compared with the high-frequency IC of the present embodiment which decides the used band by a dichotomizing search system. When the number of bands for the RFVCO is 16, for example, it is still enough on time. However, when the number of bands increases and reaches a number like 256, for example, there is a fear that lockup of the RF synthesizer is not in time for the start of reception. On the other hand, since the used band is determined by the dichotomizing search system in the high-frequency IC of the present embodiment, the lockup of the RF synthesizer can reliably be ended before the start of the reception even if the number of the bands increases.

Next, when the reception is completed, a command "Word1" containing frequency information is supplied from the baseband IC 300, the control circuit 260 enters the warm up mode for starting the VCO again (timing t6 in FIG. 14). When a bit for instructing transmission or reception in the command indicates the transmission, the control circuit 260 starts up the IFVCO 230 to start locking of the IF synthesizer 262, and performs the operation of selecting bands used for the RFVCO 250 and TXVCO 240 on the basis of the frequency information sent from the baseband IC 300. Then, the RF synthesizer 262 and the TX-PLL loop are respectively brought into a lock state after the decision of the band. Further, the control circuit 260 starts up the offset cancel circuit 213 in the warm up mode to perform input DC offset cancel of the amplifiers lying in the high-gain amplifying sections 220A and 220B. The time required to select the band used for the TXVCO 240 employed in the present embodiment may be 40 to 50 μseconds.

Thereafter, a "Word3" for instructing a transmitting operation is sent from the baseband IC 300 to the high-frequency IC 200. When the control circuit 260 receives the "Word3" therein, it enters a transmitting mode and causes a transmit signal to be modulated and amplified (timing t7 in FIG. 14). Also, the control circuit 260 performs even switching control on the switches SW1 and SW2 and the like according to GSM or DCS/PCS. Incidentally, the receiving mode and the transmitting mode are respectively executed in time units (e.g., 577 μseconds) called time slots.

In the conventional type high-frequency IC, when the "Word1" is supplied even when the control circuit enters the transmitting mode, the RF synthesizer and the IR synthesizer are locked after the frequency measurement of the RFVCO and the frequency measurement of the TXVCO have been performed. Thus, the time required to decide the used band becomes long (8 mseconds). Since, however, the used band is determined by the dichotomizing search system in the high-frequency IC of the present embodiment, the lockup of the RF synthesizer can reliably be terminated before the start of reception even if the number of bands increases. The auto band selection circuits 240 and 264 respectively stop operating after the used bands have been decided. Thus, needless current is prevented from flowing.

While the invention made above by the present inventors has been described specifically on the basis of the preferred embodiments, the present invention is not limited to the embodiments referred to above. In the above embodiment, for example, the delay compensating circuit 25 measures the amount of a delay in the signal obtained by dividing the oscillation output of the VCO and delays the timing provided for the signal φr' obtained by dividing the reference oscillation signal φr in accordance with the result of its measurement. However, the delay compensating circuit 25 is configured so as to be able to adjust only the timing without having the function of measuring the delay in the division signal φr' and may adjust the timing in accordance with the amount of delay measured separately.

When the auto band selection circuit equipped with the delay compensating circuit 25 of the second embodiment shown in FIG. 9 is applied to such a high-frequency IC 200 as shown in FIG. 13, the auto band selection circuit is operated on a time-sharing basis to make it possible to be shared between the band selections for the RF-PLL and TX-PLL. Since, in this case, the RF-PLL needs to decide the used band earlier than the TX-PLL, the band selection for the TX-PLL may be done after execution of the band selection for the RF-PLL.

Although the VCO 11 is configured so as to be switched to any of the 256 bands in the present embodiment, the number of bands may be 128 or 512 or the like. Further, although the embodiment has explained the case in which the loop filter is built in the high-frequency IC, it is possible to apply the loop filter even where it is constituted of an external element. Although a description has been made of the wireless communication system of the above embodiment applied to the high-frequency IC in which the reception-system circuit is of the direct conversion system and the transmission-system circuit is of the offset PLL system, the present invention is not limited to it. The reception-system circuit and the transmission-system circuit can be applied to the high-frequency IC of the direct conversion system together.

Although the above embodiment has explained the case in which the present invention is applied to the RF-PLL having the RFVCO, the IF-PLL having the IFVCO for generating the oscillation signal of the intermediate frequency, and the TX-PLL having the TXVCO for transmission, the present invention can be applied even to a high-frequency IC which has no IF-PLL and generates a signal of an intermediate frequency obtained by dividing an oscillation signal outputted from an RFVCO. Further, the band selection circuit according to the embodiment can be applied even to an RF-PLL and an IF-PLL in a so-called polar loop type communication system wherein a transmit signal is separated into a phase component and an amplitude component to perform control.

Although the above description has principally been made of the case in which the invention made by the present inventors is applied to the high-frequency IC employed in the wireless communication system like a cellular phone, which belongs to the field of application reaching the background of the invention, the present invention is not limited to it. The present invention can be applied to a high-frequency IC for wireless LAN and other high-frequency IC having a PLL circuit which generates a high frequency signal combined with a receive signal or a transmit signal to perform frequency conversion and modulation/demodulation.

What is claimed is:

1. A semiconductor integrated circuit for wireless communication, comprising:
  a transmission-system circuit including,
    a first oscillator configured so as to be capable of oscillating operation in plural frequency bands,
    a frequency converter which outputs a signal having an intermediate frequency corresponding to a difference between a frequency of an output signal of the first oscillator and a frequency of an output signal of a second oscillator,
    a phase comparator which compares the phase of a signal converted by the frequency converter with the phase of a transmit signal having a phase-modulated intermediate frequency to thereby detect a phase difference, and
    a loop which controls an oscillation frequency of the first oscillator in accordance with a voltage generated by a loop filter that generates a voltage corresponding to the output of the phase comparator;
  switching means capable of supplying a potential of a predetermined level to the first oscillator as a control voltage in a state in which the loop is opened;
  a variable divider which divides the output signal of the first oscillator at a designated division ratio;
  a constant divider which divides a reference signal having a predetermined frequency at a predetermined division ratio;
  a band selection circuit which compares the phase of an output signal of the variable divider with the phase of an output signal of the constant divider in a state in which the potential is supplied to the first oscillator by the switching means to thereby select an oscillation frequency band for the first oscillator; and
  timing control means which controls a timing provided for the reference signal in such a manner that the phase of a second signal which corresponds to the output of the constant divider and is used in the band selection coincides with the phase of a first signal formed based on the output signal of the variable divider and used in the band selection, wherein the timing control means delays the timing for the reference signal by a time equivalent to a delay time from the release of reset of the variable divider to the output of the signal therefrom.

2. The semiconductor integrated circuit for wireless communication according to claim 1, further comprising a measuring circuit which measures the delay time from the reset release of the variable divider to the output of the signal therefrom.

3. The semiconductor integrated circuit for wireless communication according to claim 2, wherein the timing control means and the measuring circuit share a signal delay circuit comprising a plurality of delay stages.

4. The semiconductor integrated circuit for wireless communication according to claim 1, wherein the variable divider has a prescaler capable of performing switching of a division ratio, and a first counter and a second counter each of which counts a signal divided by the prescaler, and the division ratio for the prescaler is switched by the output of the first or second counter.

5. A semiconductor integrated circuit for wireless communication, comprising:
   a first oscillator configured so as to be capable of oscillating operation in plural frequency bands;
   a variable divider which divides an output signal of the first oscillator at a designated division ratio;
   a constant divider which divides a reference signal having a predetermined frequency at a predetermined division ratio;
   a phase comparator which compares the phase of an output signal of the variable divider with the phase of an output signal of the constant divider to thereby detect a phase difference;
   a loop which controls an oscillation frequency of the first oscillator in accordance with a voltage generated by a loop filter that generates a voltage corresponding to the output of the phase comparator;
   switching means capable of supplying a potential of a predetermined level to the first oscillator as a control voltage in a state in which the loop is opened;
   a band selection circuit which compares the phase of the output signal of the variable divider with the phase of the output signal of the constant divider in a state in which the potential is supplied to the first oscillator by the switching means to thereby select an oscillation frequency band for the first oscillator;
   timing control means which controls a timing provided for a reset signal for the variable divider in such a manner that the phase of a second signal which corresponds to the output of the constant divider and is used in the band selection coincides with the phase of a first signal formed based on the output signal of the variable divider and used in the band selection, and
   wherein the timing control means changes the reset signal in such a manner that the reset signal varies with a timing earlier than the phase of the reference signal on a time basis.

6. The semiconductor integrated circuit for wireless communication according to claim 5, wherein the timing control means includes a measuring circuit which measures a difference in time between the output signal of the variable divider and the reference signal.

7. The semiconductor integrated circuit for wireless communication according to claim 6, wherein the timing control means and the measuring circuit share a signal delay circuit comprising a plurality of delay stages.

8. The semiconductor integrated circuit for wireless communication according to claim 5, wherein the variable divider has a prescaler capable of performing switching of a division ratio, and a first counter and a second counter each of which counts a signal divided by the prescaler, and the division ratio for the prescaler is switched by the output of the first or second counter.

9. A semiconductor integrated circuit for wireless communication, comprising:
   a transmission-system circuit including,
      a first oscillator configured so as to be capable of oscillating operation in plural frequency bands,
      a first variable divider which divides an output signal of the first oscillator at a designated division ratio,
      a first constant divider which divides a reference signal having a predetermined frequency at a predetermined division ratio,
      a first phase comparator which compares the phase of an output signal of the first variable divider with the phase of an output signal of the first constant divider to thereby detect a phase difference, and
      a loop which controls an oscillation frequency of the first oscillator in accordance with a voltage generated by a first loop filter that generates a voltage corresponding to the output of the first phase comparator;
   first switching means capable of supplying a potential of a predetermined level to the first oscillator as a control voltage in a state in which the loop is opened;
   a first band selection circuit which compares the phase of the output signal of the first variable divider with the phase of the output signal of the first constant divider in a state in which the potential is supplied to the first oscillator by the first switching means to thereby select an oscillation frequency band for the first oscillator;
   a reception-system circuit including,
      a second oscillator configured so as to be capable of oscillating operation in plural frequency bands,
      a second variable divider which divides an output signal of the second oscillator at a designated division ratio,
      a second constant divider which divides a reference signal having a predetermined frequency at a predetermined division ratio,
      a second phase comparator which compares the phase of an output signal of the second variable divider with the phase of an output signal of the second constant divider to thereby detect a phase difference, and
      a loop which controls an oscillation frequency of the second oscillator in accordance with a voltage generated by a second loop filter that generates a voltage corresponding to the output of the second phase comparator;
   second switching means capable of supplying a potential of a predetermined level to the second oscillator as a control voltage in a state in which the loop is opened; and
   a second band selection circuit which compares the phase of the output signal of the second variable divider with the phase of the output signal of the second constant divider in a state in which the potential is supplied to the second oscillator by the second switching means to thereby select an oscillation frequency band for the second oscillator;
   wherein the first band selection circuit delays a timing for the reference signal by a time equivalent to a delay time from the release of the first variable divider to the output of the signal therefrom and selects an oscillation frequency band for the first oscillator on the basis of the delayed reference signal and the output signal of the first variable divider, and wherein the second band selection circuit compares the output signal of the second variable divider with the reference signal and thereby controls a reset timing for the second variable divider, and selects an oscillation frequency band for the second oscillator on the basis of the reference signal and the output signal of the second variable divider.

10. The semiconductor integrated circuit for wireless communication according to claim 9, wherein the first band selection circuit includes a first measuring circuit which measures a delay time from the release of reset of the first variable divider to the output of the signal therefrom and delays the timing for the reference signal in accordance with the time measured by the first measuring circuit.

11. The semiconductor integrated circuit for wireless communication according to claim 9, wherein the second band selection circuit includes a second measuring circuit which measures a difference in time between the output signal of the second variable circuit and the reference signal and makes earlier the reset timing for the second variable divider in accordance with the time measured by the second measuring circuit.

* * * * *